(12) United States Patent
Hara et al.

(10) Patent No.: US 9,177,661 B2
(45) Date of Patent: Nov. 3, 2015

(54) SEMICONDUCTOR MEMORY DEVICE

(71) Applicant: Kabushiki Kaisha Toshiba, Minato-ku (JP)

(72) Inventors: Tokumasa Hara, Kawasaki (JP); Naoya Tokiwa, Fujisawa (JP); Hiroshi Sukegawa, Tokyo (JP); Hitoshi Iwai, Kamakura (JP); Toshifumi Shano, Fujisawa (JP); Shirou Fujita, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/142,153

(22) Filed: Dec. 27, 2013

(65) Prior Publication Data
US 2015/0036434 A1    Feb. 5, 2015

Related U.S. Application Data

(60) Provisional application No. 61/861,643, filed on Aug. 2, 2013.

(51) Int. Cl.
*G11C 11/34* (2006.01)
*G11C 16/26* (2006.01)
*G11C 16/04* (2006.01)

(52) U.S. Cl.
CPC ............ *G11C 16/26* (2013.01); *G11C 16/0483* (2013.01)

(58) Field of Classification Search
CPC .............................. G11C 16/10; G11C 16/0483

USPC ........................................ 365/185.17, 185.24
See application file for complete search history.

(56) References Cited

U.S. PATENT DOCUMENTS

| | | | | |
|---|---|---|---|---|
| 7,885,112 B2 * | 2/2011 | Li et al. | .................... | 365/185.12 |
| 8,385,121 B2 * | 2/2013 | Sarin et al. | ............... | 365/185.12 |
| 2005/0082579 A1 | 4/2005 | Horii et al. | | |
| 2009/0249106 A1 * | 10/2009 | Sajayan et al. | ................ | 713/324 |
| 2012/0297245 A1 * | 11/2012 | Li et al. | ............................ | 714/15 |
| 2014/0084936 A1 * | 3/2014 | Pan et al. | ....................... | 324/509 |

FOREIGN PATENT DOCUMENTS

| | | |
|---|---|---|
| JP | 02-192099 A | 7/1990 |
| JP | 2011-090735 A | 5/2011 |
| TW | 200802369 | 1/2008 |
| WO | WO 03-073430 A1 | 9/2003 |

OTHER PUBLICATIONS

Office Action issued Jun. 12, 2015 in Taiwanese Patent Application No. 102131691 (with English translation).

* cited by examiner

*Primary Examiner* — Michael Tran
(74) *Attorney, Agent, or Firm* — Oblon, McClelland, Maier & Neustadt, L.L.P.

(57) ABSTRACT

According to one embodiment, a semiconductor memory device reads data in units of page. The device includes: a memory cell array; a plurality of latch circuits; and an arithmetic operation circuit. The memory cell array holds data multiplexed in at least three pages. The latch circuits read and hold the multiplexed data at a startup. The arithmetic operation circuit performs operations by use of the multiplexed data.

23 Claims, 19 Drawing Sheets

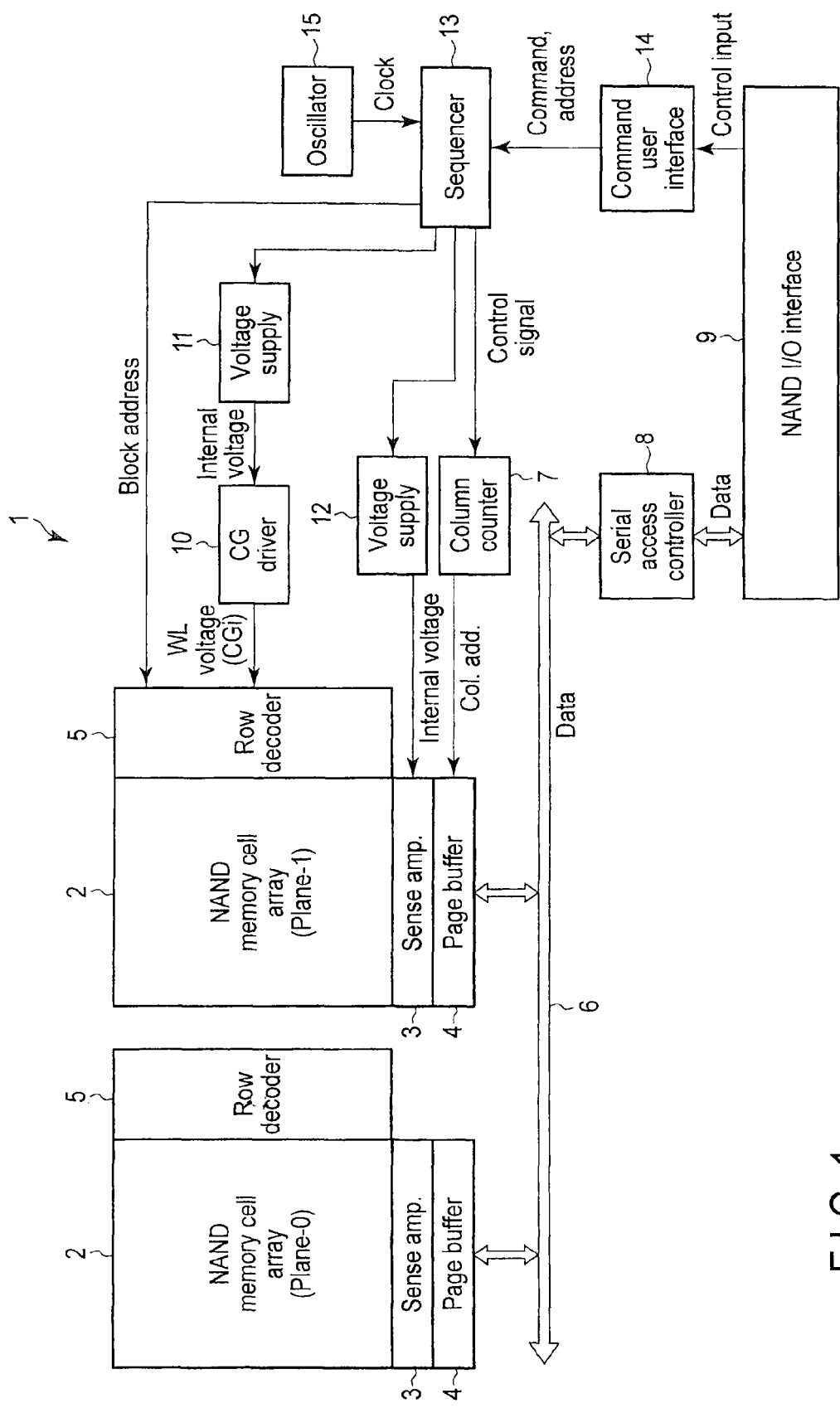
F I G. 1

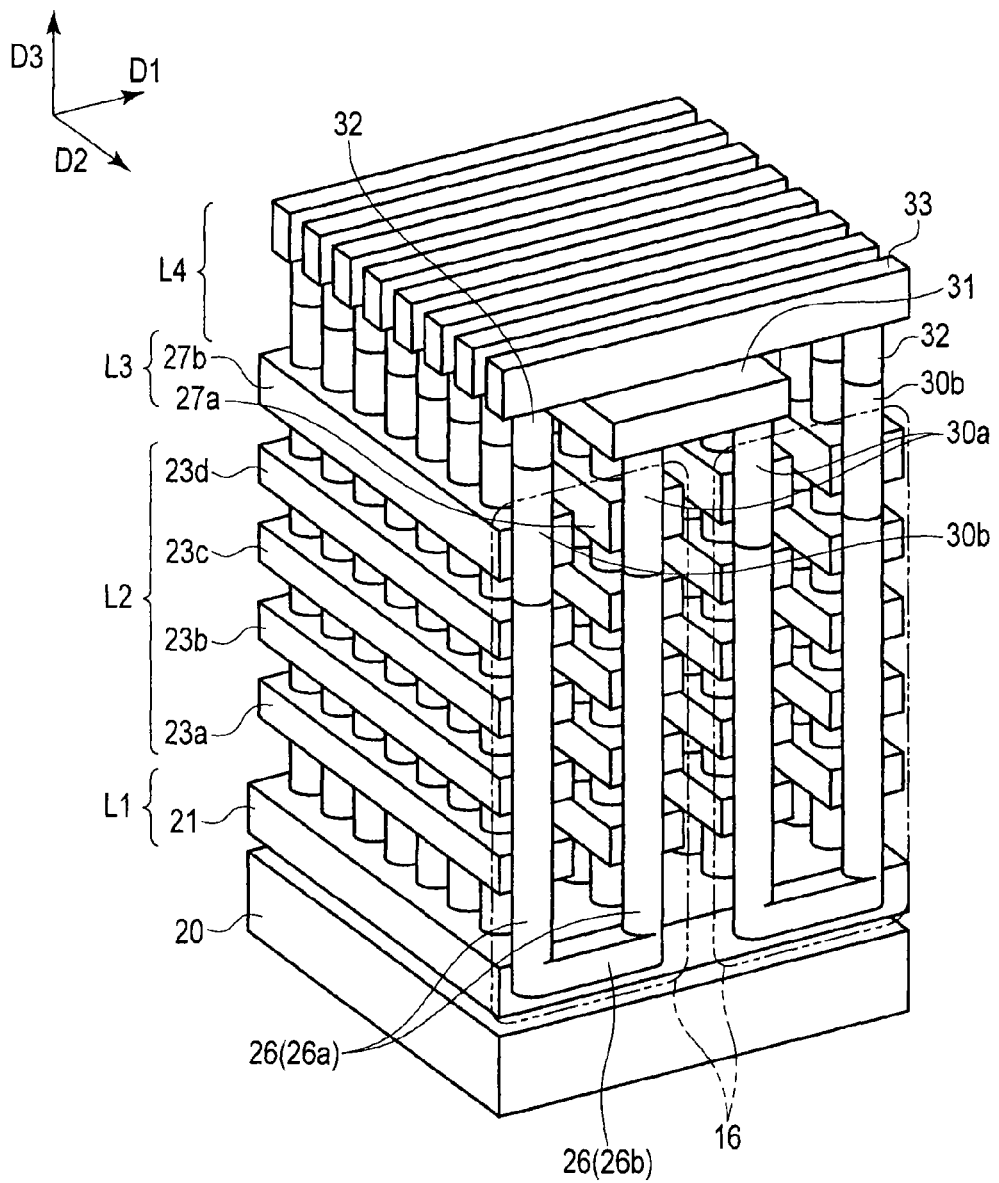
F I G. 3

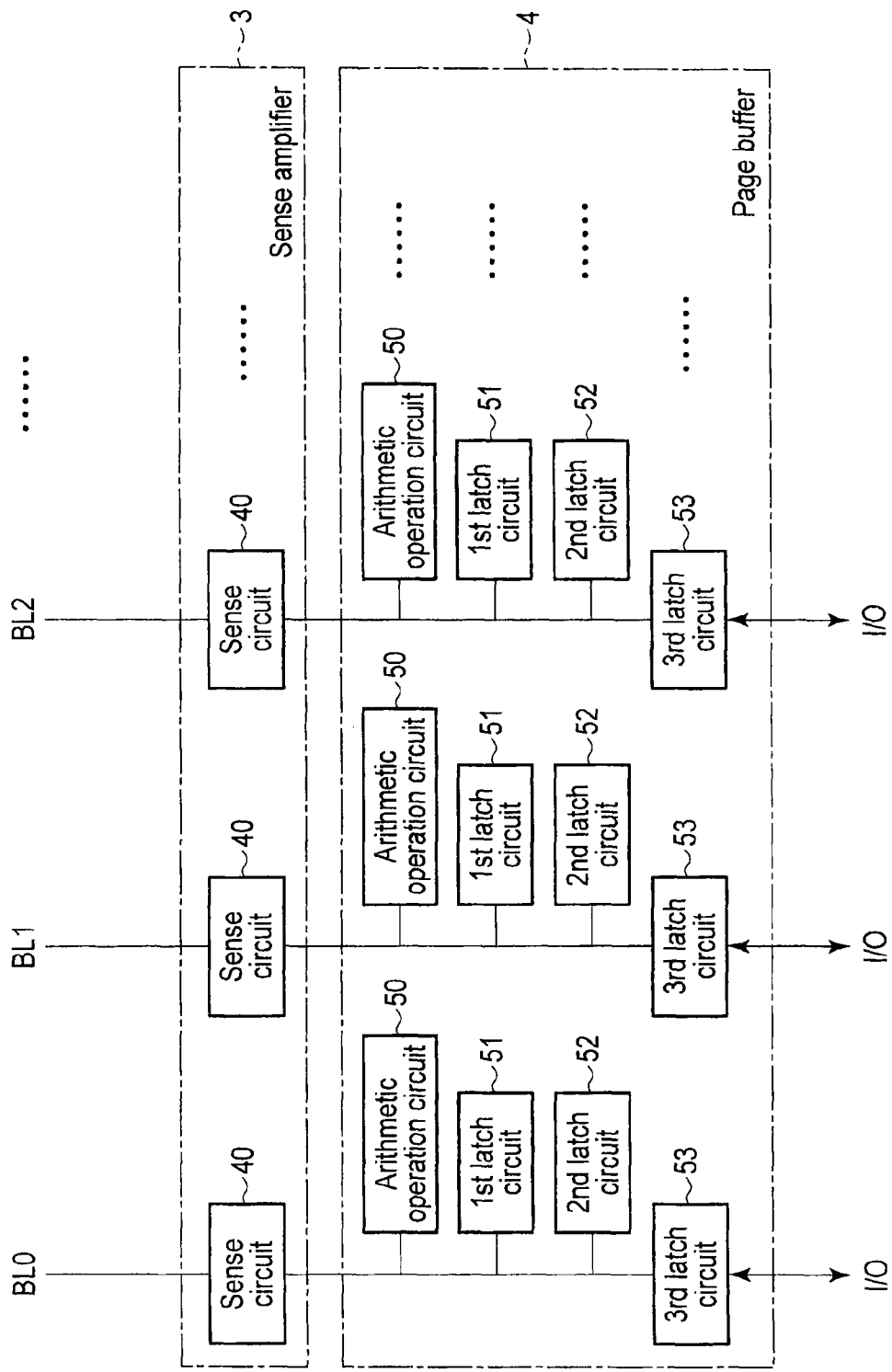
F I G. 5

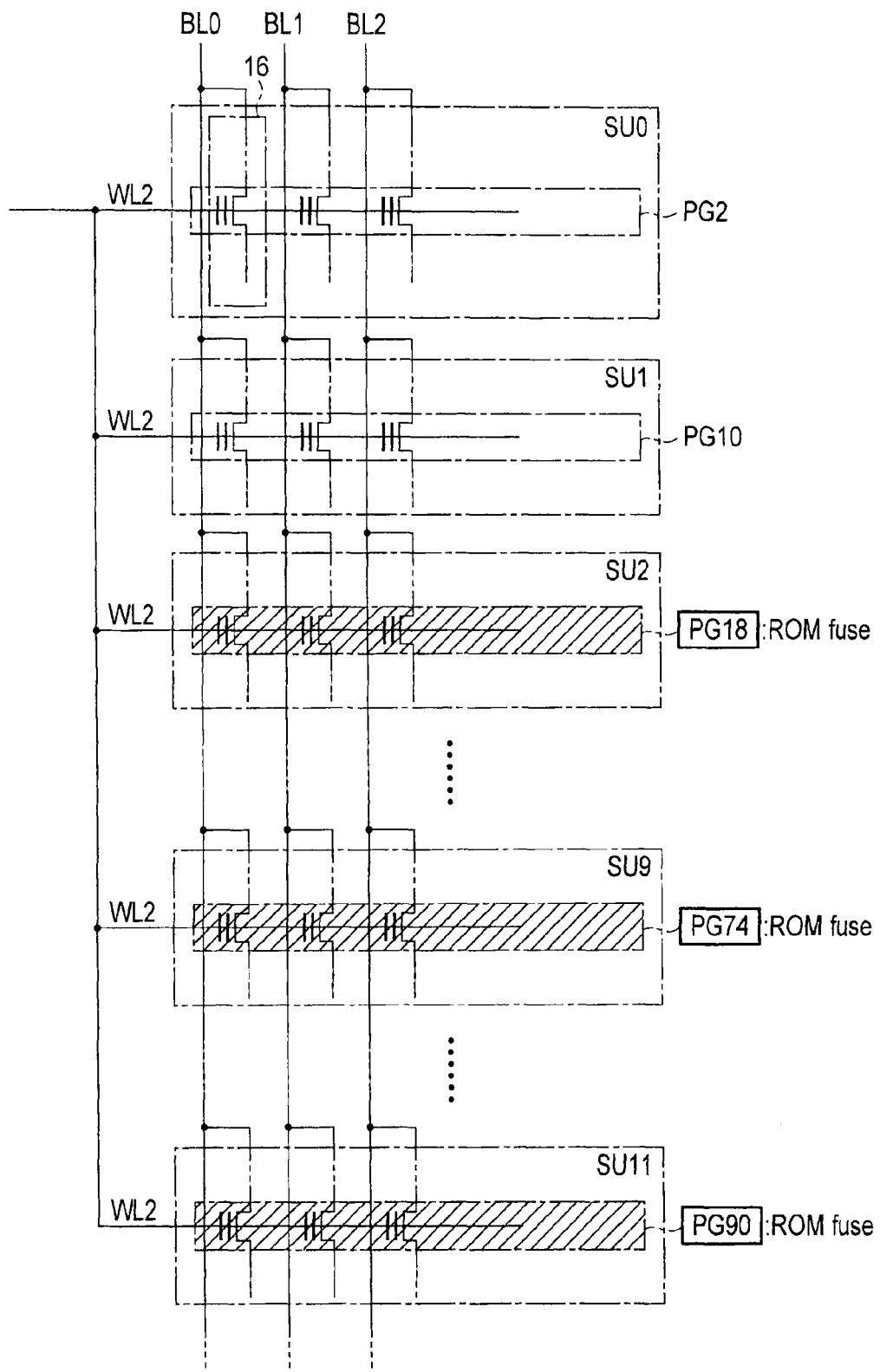
F I G. 7

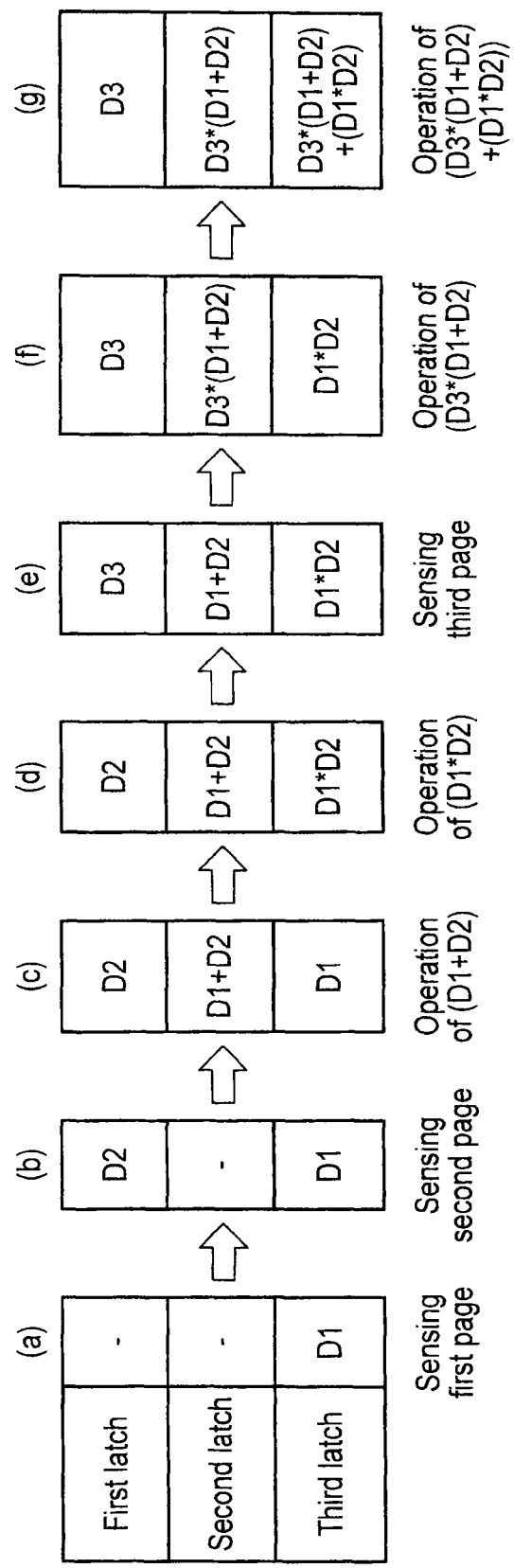
F I G. 10

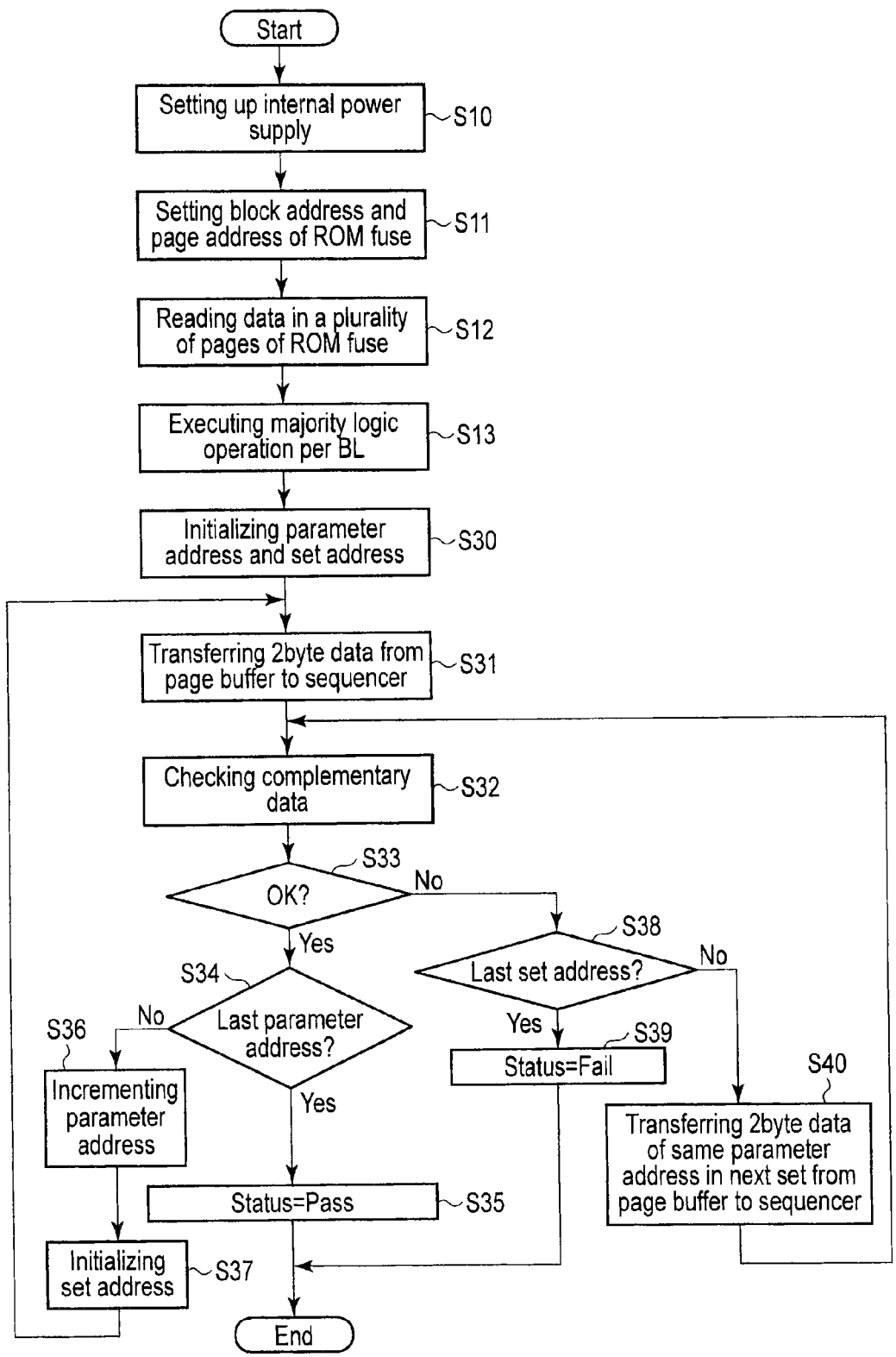
F I G. 16

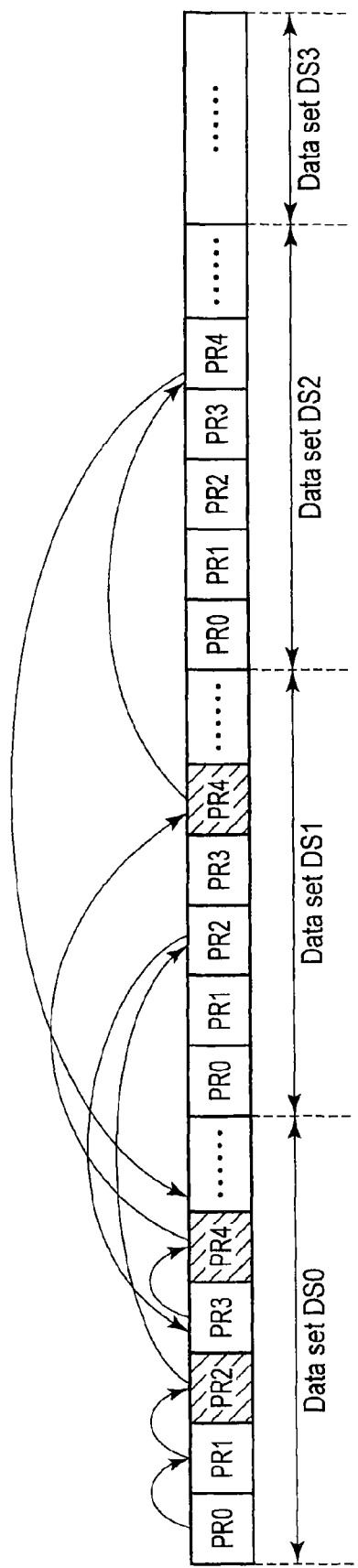
F I G. 17

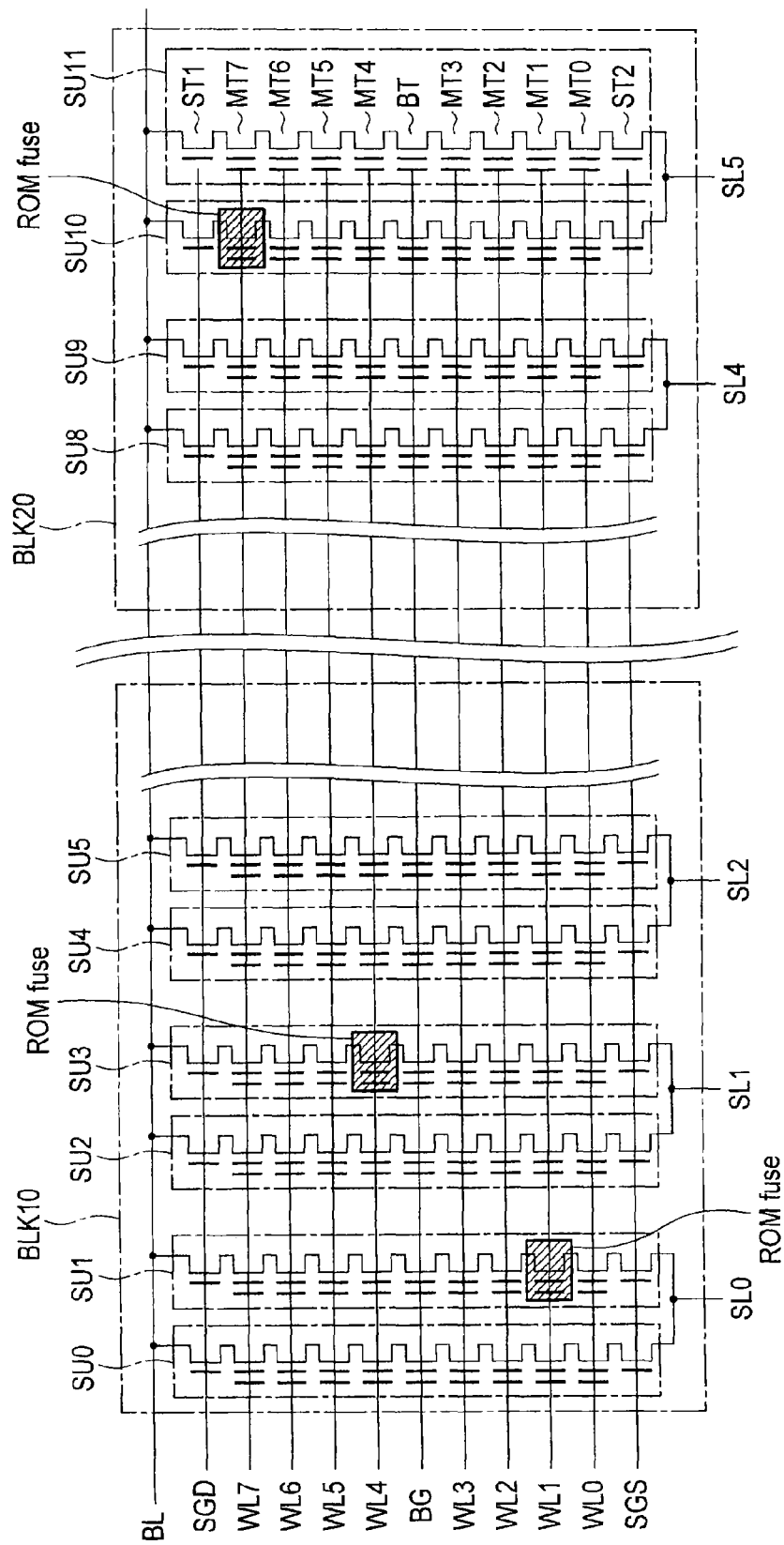
F I G. 18

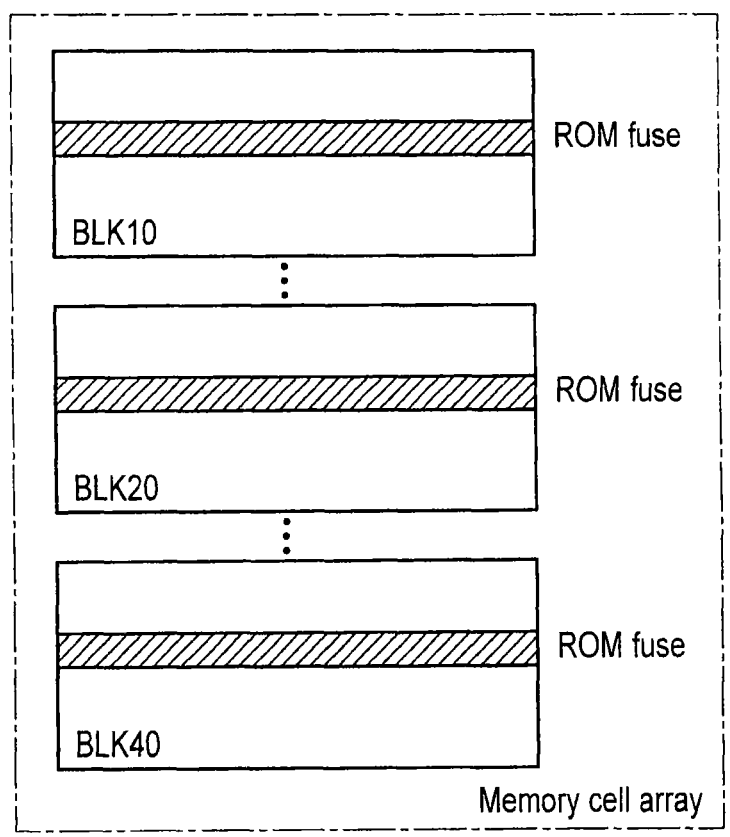
F I G. 20

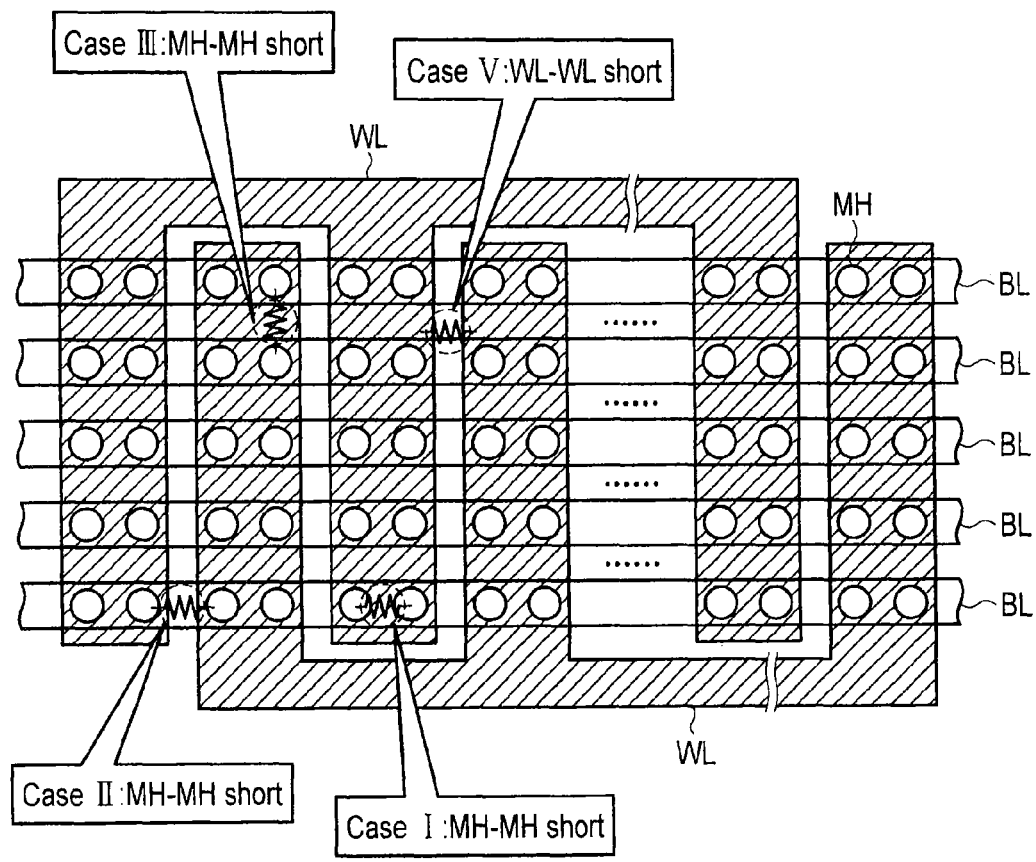
F I G. 22

SEMICONDUCTOR MEMORY DEVICE

CROSS-REFERENCE TO RELATED APPLICATIONS

This application claims the benefit of U.S. Provisional Application No. 61/861,643, filed Aug. 2, 2013, the entire contents of which are incorporated herein by reference.

FIELD

Embodiments described herein relate generally to a semiconductor memory device.

BACKGROUND

A NAND flash memory is known in which memory cells are three-dimensionally arranged.

BRIEF DESCRIPTION OF THE DRAWINGS

FIG. 1 is a block diagram showing a semiconductor memory device according to a first embodiment;

FIG. 3 and FIG. 4 are a perspective view and cross-sectional view of the memory cell array according to the first embodiment;

FIG. 5 is a block diagram of a sense amplifier and page buffer according to the first embodiment;

FIG. 7 is a circuit diagram of the ROM fuse block according to the first embodiment;

FIG. 10 is a diagram showing a majority logic operation method according to the first embodiment;

FIG. 16 is a flowchart of a read method according to the second embodiment;

FIG. 17 is a schematic diagram showing a concrete example of a data transfer method according to the second embodiment;

FIG. 18 is a circuit diagram of a memory cell array according to a third embodiment;

FIG. 20 is a block diagram of the memory cell array according to the third embodiment;

FIG. 22 is a plan view of the memory cell array.

DETAILED DESCRIPTION

Figure 2:
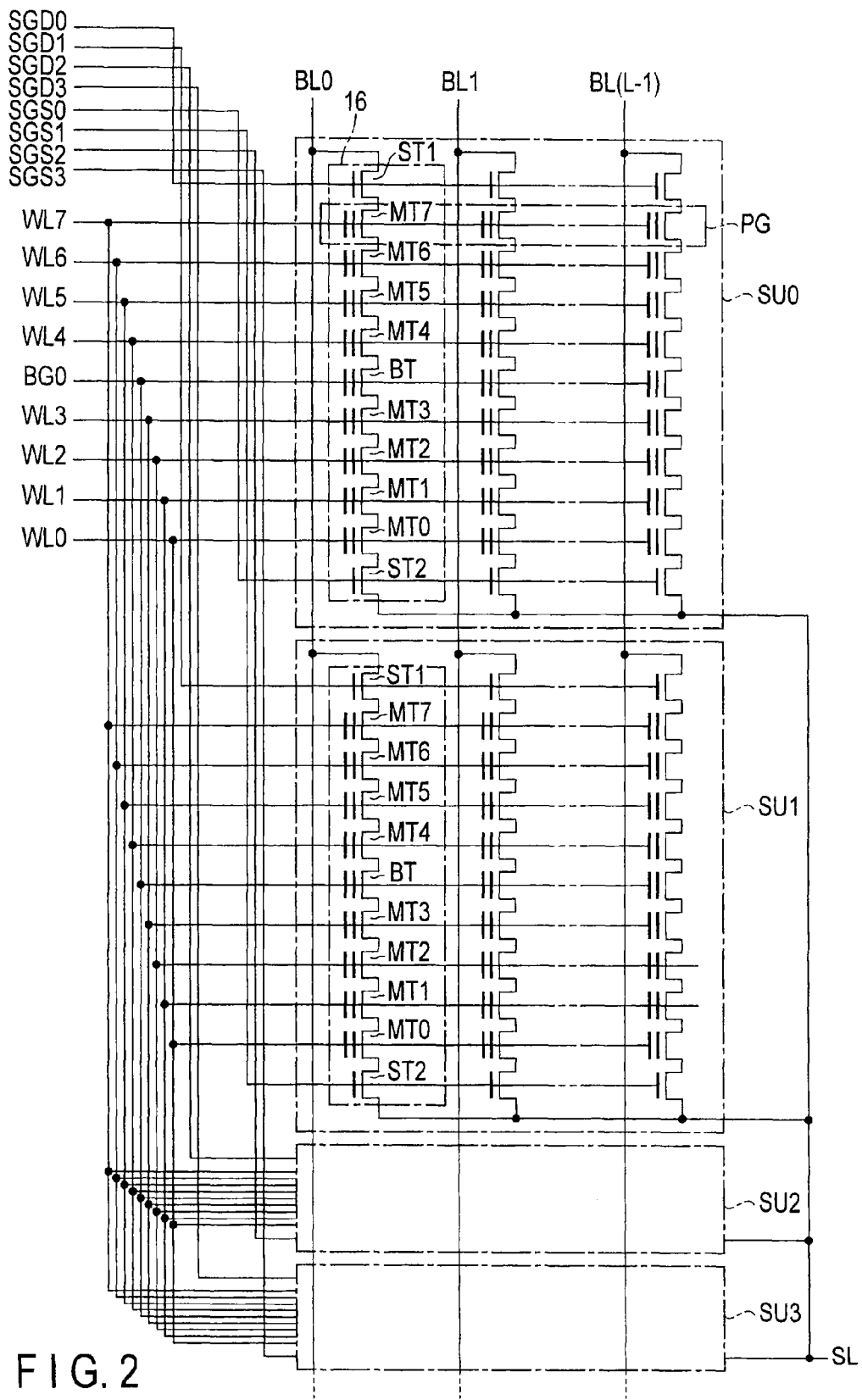
FIG. 2 is a circuit diagram of a memory cell array according to the first embodiment.

In general, according to one embodiment, a semiconductor memory device reads data in units of page. The device includes a memory cell array; a plurality of latch circuits; and an arithmetic operation circuit. The memory cell array holds data multiplexed in at least three pages. The plural latch circuits read and hold multiplexed data at the starting-up. The arithmetic operation circuit performs operations by use of multiplexed data.

1. First Embodiment

A semiconductor memory device according to a first embodiment is explained. In the following description, an example in which a three-dimensional stacked NAND flash memory having memory cells stacked above a semiconductor substrate is used as a semiconductor memory device is explained.

1.1 Configuration of Semiconductor Memory Device

First, the configuration of the semiconductor memory device according to this embodiment is explained.

1.1.1 Whole Configuration of Semiconductor Memory Device

FIG. 1 is a block diagram showing a NAND flash memory according to this embodiment. As shown in FIG. 1, a NAND flash memory 1 includes memory cell arrays 2, sense amplifiers 3, page buffers 4, row decoders 5, data bus 6, column counter 7, serial access controller 8, I/O interface 9, CG driver 10, voltage supply circuits 11, 12, sequencer 13, command user interface 14 and oscillator 15.

The memory cell array 2 includes a plurality of nonvolatile memory cells three-dimensionally stacked. In the memory cell array 2, the memory cells in the same row are connected to the same word line and the memory cells in the same column are connected to the same bit line. Data written in the memory cell and data read from the memory cell are transferred via the bit line. In the example of FIG. 1, a case wherein the memory 1 includes two memory cell arrays 2 is shown, but the memory 1 may include one memory cell array or three or more memory cell arrays.

The sense amplifier 3, page buffer 4 and row decoder 5 are provided for each memory cell array 2. The sense amplifier 3 senses and amplifies data read from the memory cell to the bit line. The page buffer 4 includes a plurality of latch circuits provided in correspondence to the bit lines, temporarily holds data sensed and amplified by the sense amplifier 3 and outputs the above data to the data bus 6 at the data reading. Further, the page buffer 4 temporarily holds write-data and transfers the write-data to the bit line at the data writing. The row decoder 5 selects the row direction of the memory cell array 2. That is, the row decoder 5 selects the word line.

The voltage supply circuit 12 generates voltages to be applied to the bit lines and supplies the voltages to the sense amplifiers 3 at the data reading and data writing. The sense amplifier 3 applies a necessary voltage to the bit line according to write-data in the page buffer 4. The column counter 7 receives a control signal from the sequencer 13 at the data reading and data writing. Then, the column counter 7 acquires a column address based on the received control signal and outputs the same to the page buffer 4. The page buffer decodes the column address and connects the latch in the page buffer 4 to the data bus 6 based on the result of decoding.

The voltage supply circuit 11 generates voltages to be applied to the word lines and supplies the voltages to the CG driver 10 at the data reading, data writing and data erasing. The CG driver 10 transfers necessary voltages among the voltages supplied from the voltage supply circuit 11 to the word line selected by the row decode 5 and non-selected word lines.

The I/O interface 9 controls transfer of a signal with respect to a host device or controller (not shown) that controls the NAND flash memory 1. The I/O interface 9 receives write-data and a control signal (write-command and address) from the controller at the data writing. Then, the interface 9 transfers the control signal to the command user interface 14 and transfers the write-data to the serial access controller 8. At the data reading, the interface 9 receives a control signal (read-command and address) from the controller and transfers the control signal to the command user interface 14. Then, the interface 9 receives read-data from the serial access controller 8 and transfers the same to the controller.

The data bus 6 transfers read-data from the page buffer 4 to the serial access controller 8 at the data reading and transfers write-data from the serial access controller 11 to the page buffer 4 at the data writing.

The serial access controller 11 controls parallel transfer of data on the data bus 6. At the data writing, data from the controller is serially transmitted to the I/O interface 9. The serial data is transferred to the page buffer 4 in parallel on the data bus 6. The reverse operation is performed at the data reading. The above control operation is performed by the serial access controller 11.

The command user interface 14 receives a control signal from the I/O interface and decodes the control signal to acquire a command and address. Then, the interface 14 transfers the command and address to the sequencer 13. The oscillator 15 generates a clock.

The sequencer 13 controls the whole operation of the NAND flash memory 1. The sequencer 13 controls the operations of the column counter 7 and voltage supply circuits 11, 12 based on the clock from the oscillator 15 and the command and address from the command user interface 14.

1.1.2 Memory Cell Array 2

Next, the configuration of the memory cell array 2 is explained in detail. The memory cell array 2 includes a plurality of blocks. Data items in the same block are simultaneously erased.

The configuration of the block is explained with reference to FIG. 2. FIG. 2 is a circuit diagram of one block.

As shown in the drawing, the block includes M (M is a natural number equal to or larger than 2) string units SU (SU0 to SU(M−1)). Each string unit SU includes L (L is a natural number equal to or larger than 2) NAND strings 16.

For example, each NAND string 16 includes eight memory cell transistors MT (MT0 to MT7), selection transistors ST1, ST2, and back-gate transistor BT. Memory cell transistor MT includes a stacked gate that includes a control gate and charge accumulation layer and holds data in a nonvolatile fashion. The number of memory cell transistors MT is not limited to eight and may be set to 16, 32, 64, 128, for example, and the number is not limited at all. Like memory cell transistor MT, back-gate transistor BT includes a stacked gate that includes a control gate and charge accumulation layer. However, back-gate transistor BT is not used for holding data and functions as a simple current path at the data writing and data erasing. Memory cell transistors MT and back-gate transistor BT are arranged to have the current paths serially connected between selection transistors ST1 and ST2. Back-gate transistor BT is connected between memory cell transistors MT3 and MT4. The current path of memory cell transistor MT7 on one end side of the series-connection is connected to one end of the current path of selection transistor ST1 and the current path of memory cell transistor MT0 on the other end side is connected to one end of the current path of selection transistor ST2.

The gates of selection transistors ST1 of respective string units SU0 to SU(M−1) are commonly connected to selection gate lines SGD0 to SGD(M−1), respectively, and the gates of selection transistors ST2 are commonly connected to selection gate lines SGS0 to SGS(M−1), respectively. Further, the control gates of memory cell transistors MT0 to MT7 in the same block BLK0 are commonly connected to respective word lines WL0 to WL7 and the control gates of back-gate transistors BT are commonly connected to back-gate line BG of each block, for example.

That is, the word lines WL0 to WL7 and the back-gate line BG are connected in the string units SU0 to SU(L−1) in the same block in common, whereas the selection gate lines SGD and SGS are independent in accordance with each of the string units SU0 to SU(M−1) even in the same block.

Further, the other ends of the current paths of the selection transistors ST1 of the NAND strings 16 provided in the same row in the NAND strings 16 arranged in the matrix form in the memory cell array 2 are connected to any one of the bit lines BL (BL0 to BL(L−1)) in common. Furthermore, the bit line BL connects the NAND strings 16 in common over the blocks. Moreover, the other ends of the current paths of the selection transistors ST2 are connected to the source line SL in common. The source line SL connects the NAND strings 16 in common over the string units SU.

As described above, data in the memory cell transistors MT in the same block is collectively erased. On the other hand, data reading and data writing is collectively carried out with respect to the memory cell transistors MT connected to any word line WL in common in any string unit SU in any block. This unit is called a "page".

Figure 4:
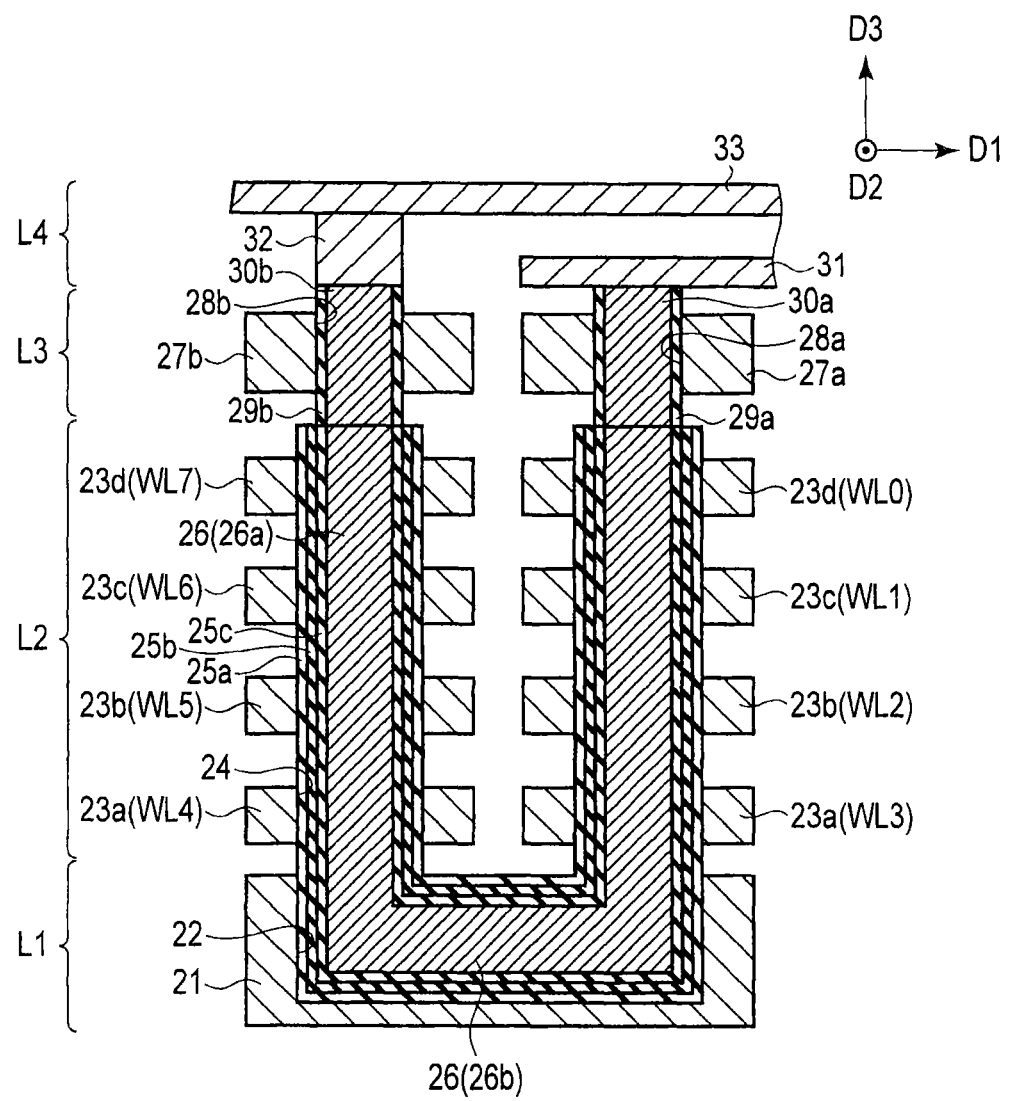

Next, the three-dimensional stacked configuration of the memory cell array 2 will now be described with reference to FIG. 3 and FIG. 4. FIG. 3 and FIG. 4 are a perspective view and a cross-sectional view of the memory cell array 2.

As shown in the drawing, the memory cell array 2 is provided above a semiconductor substrate 20. That is, peripheral circuits, e.g., the sense amplifier 3, the page buffer 4, and others are formed on the semiconductor substrate 20, and the memory cell array 2 is formed above these peripheral circuits. Additionally, the memory cell array 2 has a back-gate transistor layer L1, a memory cell transistor layer L2, a selection transistor layer L3, and an interconnects layer L4 sequentially formed above the semiconductor substrate 20.

The back-gate transistor layer L1 functions as the back-gate transistor BT. The memory cell transistor layer L2 functions as the memory cell transistors MT0 to MT7 (the NAND string 16). The selection transistor layer L3 functions as the selection transistors ST1 and ST2. The interconnects layer L4 functions as the source lines SL and the bit lines BL.

The back-gate transistor layer L1 has a back-gate conductive layer 21. The back-gate conductive layer 21 is formed to two-dimensionally extend in a first direction and a second direction that are parallel to the semiconductor substrate 20 (that is, the first direction and the second direction are orthogonal to a third direction along which the memory cells are stacked). The back-gate conductive layer 21 is separated for each block. The back-gate conductive layer 21 is made of, e.g., polycrystalline silicon. The back-gate conductive layer 21 functions as a back-gate line BG.

Further, the back-gate conductive layer 21 has a back-gate hole 22 as shown in FIG. 4. The back-gate hole 22 is made to scoop out the back-gate conductive layer 21. The back-gate hole 22 is made into an almost rectangular shape having a longitudinal direction in the first direction when viewed from the upper surface.

The memory cell transistor layer L2 is formed above the back-gate conductive layer L1. The memory cell transistor layer L2 includes word line conductive layers 23a to 23d. The word line conductive layers 23a to 23d are stacked with interlayer dielectric layers (not shown) being sandwiched between them. The word line conductive layers 23a to 23d are formed into a stripe shape extending along the second direction with a predetermined pitch in the first direction. The word line conductive layers 23a to 23d are made of, e.g., polycrystalline silicon. The word line conductive layer 23a functions as control gates (word lines WL3 and WL4) of the memory cell transistors MT3 and MT4, the word line conductive layer 23b functions as control gates (word lines WL2 and WL5) of the memory cell transistors MT2 and MT5, the word line conductive layer 23c functions as control gates (word lines WL1 and WL6) of the memory cell transistors MT1 and MT6, and the word line conductive layer 23d functions as control gates (word lines WL0 and WL7) of the memory cell transistors MT0 and MT7.

Additionally, as shown in FIG. 4, the memory cell transistor layer L2 has a memory hole 24. The memory hole 24 is made to extend through the word line conductive layers 23a to 23d. The memory hole 24 is made to align with the vicinity of an end portion of the back-gate hole 22 in the first direction.

Further, as shown in FIG. 4, the back-gate transistor layer L1 and the memory cell transistor layer L2 have a block insulating layer 25a, an charge accumulation layer 25b, a tunnel insulating layer 25c, and a semiconductor layer 26. The semiconductor layer 26 functions as a body of the NAND string 16 (the back-gate of each transistor).

As shown in FIG. 4, the block insulating layer 25a is formed with a predetermined thickness on a sidewall facing the back-gate hole 22 and the memory hole 25. The charge storage layer 25b is formed with a predetermined thickness on a side surface of the block insulating layer 25a. The tunnel insulating layer 25c is formed with a predetermined thickness on a side surface of the charge storage layer 25b. The semiconductor layer 26 is formed in contact with a side surface of the tunnel insulating layer 25c. The semiconductor layer 26 is formed to fill the back-gate hole 22 and the memory hole 24.

The semiconductor layer 26 is formed into a U-like shape when viewed in the second direction. That is, the semiconductor layer 26 includes a pair of pillar portions 26a extending in a direction perpendicular to the surface of the semiconductor substrate 20 and a connecting portion 26b that connects the lower ends of the pair of pillar portions 26a.

The block insulating layer 25a and the tunnel insulating layer 25c are made of, e.g., a silicon oxide (SiO$_2$). The charge accumulation layer 25b is made of, e.g., a silicon nitride (SiN). The semiconductor layer 26 is made of polycrystalline silicon. The block insulating layer 25a, the charge accumulation layer 25b, the tunnel insulating layer 25c, and the semiconductor layer 26 form an MONOS type transistor that functions as a memory transistor MT.

In other words, the back-gate transistor layer L1 has the configuration that the tunnel insulating layer 25c is formed to surround the connecting portion 26b. The back-gate conductive layer 21 is formed to surround the connecting portion 26b.

Furthermore, in other words, the memory transistor layer L2 has the configuration that the tunnel insulating layer 25c is formed to surround the pillar portions 26a. The charge accumulation layer 25b is formed to surround the tunnel insulating layer 25c. The block insulating layer 25a is formed to surround the charge accumulation layer 25b. The word line conductive layers 23a to 23d are formed to surround the block insulating layers 25a to 25c and the pillar portions 26a.

As shown in FIG. 3 and FIG. 4, the selection transistor layer L3 includes conductive layers 27a and 27b. The conductive layers 27a and 27b are formed into a stripe shape extending along the second direction to have a predetermined pitch in the first direction. A pair of conductive layers 27a and a pair of conductive layers 27b are alternately arranged in the first direction. The conductive layer 27a is formed in an upper layer of one pillar portion 26a, and the conductive layer 27b is formed in an upper layer of the other pillar portion 26a.

The conductive layers 27a and 27b are made of polycrystalline silicon. The conductive layer 27a functions as the gate of the selection transistor ST2 (the selection gate line SGS), and the conductive layer 27b functions as the gate of the selection transistor ST1 (the selection gate line SGS).

As shown in FIG. 4, the selection transistor layer L3 has holes 28a and 28b. The holes 28a and 28b respectively extend through the conductive layers 27a and 27b. Moreover, the holes 28a and 28b are aligned with the memory holes 24.

As shown in FIG. 4, the selection transistor layer L3 includes gate insulating layers 29a and 29b and semiconductor layers 30a and 30b. The gate insulating layers 29a and 29b are formed on sidewalls facing the holes 28a and 28b, respectively. The semiconductor layers 30a and 30b are formed into a pillar shape extending in a direction perpendicular to the surface of the semiconductor substrate 20 so as to come in contact with the gate insulating layers 29a and 29b, respectively.

The gate insulating layers 29a and 29b are formed of silicon oxide (SiO$_2$), for example. The semiconductor layers 30a and 30b are formed of polycrystalline silicon, for example.

In other words, the selection transistor layer L3 has the configuration that the gate insulating layer 29a is formed to surround the pillar semiconductor layer 30a. The conductive layer 27a is formed to surround the gate insulating layer 29a and the semiconductor layer 30a. Furthermore, the gate insulating layer 29b is formed to surround the pillar semiconductor layer 30b. The conductive layer 27b is formed to surround the gate insulating layer 29b and the semiconductor layer 30b.

As shown in FIG. 3 and FIG. 4, the interconnects layer L4 is formed above the selection transistor layer L3. The interconnects layer L4 includes a source line layer 31, a plug layer 32, and a bit line layer 33. The source line layer 31 is formed into a plate-like shape extending in the second direction. The source line layer 31 is formed to be in contact with upper surfaces of one pair of semiconductor layers 27a adjacent to each other in the first direction. The plug layer 32 is formed to be in contact with an upper surface of the semiconductor layer 27b and to extend in the direction perpendicular to the surface of the semiconductor substrate 20. The bit line layer 33 is formed into a stripe-like shape extending along the first direction with a predetermined pitch in the second direction. The bit line layer 33 is formed to be in contact with an upper surface of the plug layer 32. The source line layer 31, the plug layer 32, and the bit line layer 33 are made of a metal such as tungsten (W). The source line layer 31 functions as the source line SL explained in conjunction with FIG. 2 and FIG. 3, and the bit line layer 33 functions as the bit line BL.

1.1.3 Sense Amplifier 3

Next, the configuration of the sense amplifier 3 is explained with reference to FIG. 5. FIG. 5 is a block diagram showing the sense amplifier 3 and page buffer 4.

As shown in the drawing, the sense amplifier 3 includes a plurality of sense circuits 40. The sense circuits 40 are provided for respective bit lines BL0 to BL(L−1). Each sense amplifier 40 senses and amplifies data read to corresponding bit line BL and outputs the result to the page buffer 4 at the data reading. Further, at the data writing, each sense circuit transfers write-data transferred from the page buffer 4 to corresponding bit line BL and writes the data in memory cell transistor MT.

The data read and write operations are simultaneously performed in the page unit.

1.1.4 Page Buffer 4

Next, the configuration of the page buffer 4 is explained with reference to FIG. 5.

As shown in the drawing, the page buffer 4 includes arithmetic operation circuits 50 and first to third latch circuits 51 to 53 that are provided for respective bit lines BL. The arithmetic operation circuits 50 and first to third latch circuits 51 to 53 are connected via internal buses to communicate with one another and are also connected to communicate with the corresponding sense circuits 40.

The arithmetic operation circuit 50 performs various operations such as a logical OR operation and logical AND operation for data items held in the first to third latch circuits 51 to 53.

The first to third latch circuits 51 to 53 hold data items. The third latch circuits 53 are connected to the data bus 6. That is, transfer of data between the page buffer 4 and the exterior (I/O) is performed by the third latch circuits 53.

1.1.5 ROM Fuse

Next, the ROM fuse of the NAND flash memory according to this embodiment is explained.

Figure 6:
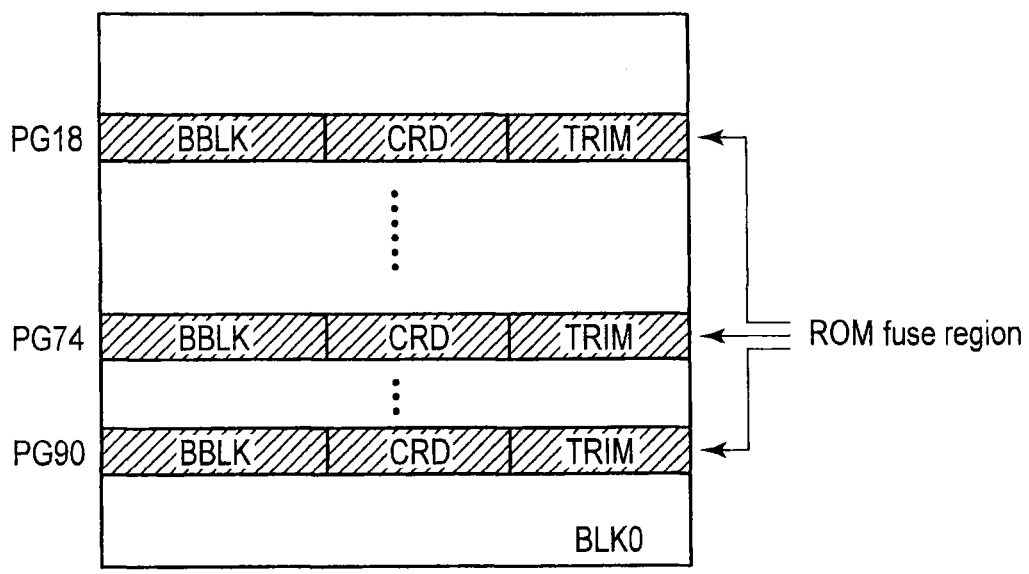
FIG. 6 is a schematic view of a ROM fuse block according to the first embodiment.

The ROM fuse is a region that holds specific (inherent) information of the NAND flash memory 1. The ROM fuse is the region that is inhibited from being accessed from the exterior except the time when the information is recorded in a test before shipment. FIG. 6 is a conceptual view of a ROM fuse.

As shown in the drawing, in this example, block BLK0 is used as a ROM fuse block and, for example, pages PG18, PG74 and PG90 in the block are used as ROM fuse regions. In the ROM fuse regions, control information of the NAND flash memory, for example, bad block information BBLK, column redundancy information CRD, trimming information TRIM and the like are stored.

Bad block information BBLK is information related to a bad block (a block that is determined unusable) and includes a block address of the bad block, for example. Column redundancy information CRD is replacement information of a defective column (a column including a defective bit line or defective sense amplifier) and includes column addresses of a defective column and a normal column to be used for replacing the defective column. Trimming information TRIM is information used for optimizing the settings of voltages for respective chips or respective manufacturing lots by previously considering manufacturing fluctuations between the chips or between the manufacturing lots. The above information items are summarized as ROM fuse information.

The ROM fuse information is stored in plural pages (in this example, page PG18, PG74 and PG90) and pages PG18, PG74 and PG90 hold the same ROM fuse information. That is, in this example, the ROM fuse information is multiplexed in three pages.

FIG. 7 more concretely shows the configuration of ROM fuse block BLK0. In the drawing, a case wherein twelve string units SU are included in block BLK0, the number of word lines in each string unit SU is eight and each memory cell transistor MT holds one-bit data is shown.

As shown in the drawing, page PG18 is a set of memory cell transistors MT connected to word line WL2 in string unit SU2. Further, page PG74 is a set of memory cell transistors MT connected to word line WL2 in string unit SU9. Additionally, page PG90 is a set of memory cell transistors MT connected to word line WL2 in string unit SU11. In this example, three pages used as the ROM fuse regions are pages allocated to the same word line WL2, but may be pages allocated to different word lines WL.

The relationship between word line WL and page PG explained above is shown only as one example. For example, if memory cell transistor MT holds 2-bit data, two pages of the upper and lower pages corresponding to the upper and lower bits of 2-bit data are allocated to one word line. Therefore, the number of pages in one block becomes twice the above case and page PG used as the ROM fuse region may become different from that of FIG. 7. This is true when memory cell transistor MT holds data of three or more bits.

The operation of writing ROM fuse information is performed at the test time before shipment of the NAND flash memory 1.

1.2 Read Method of ROM Fuse Information

Next, a read method of ROM fuse information according to this embodiment is explained.

1.2.1 Entire Flow

Figure 8:
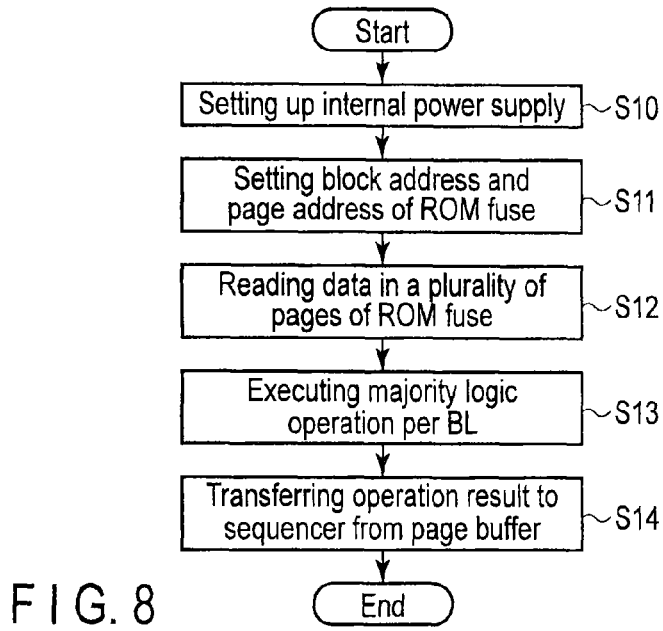
FIG. 8 is a flowchart of a read method according to the first embodiment.

First, the entire operation flow is explained with reference to FIG. 8. FIG. 8 is a flowchart of the operation of the NAND flash memory 1 immediately after the power supply is turned on. The operation of FIG. 8 is performed when the power supply of the NAND flash memory 1 is turned on. The NAND flash memory 1 may voluntarily perform the operation of FIG. 8 in response to power-on without an instruction from the controller that controls the NAND flash memory 1 or may perform the operation in response to an instruction from the controller.

If the power supply is turned on as shown in the drawing, for example, the sequencer 13 sets up the internal power supply (step S10). That is, the sequencer 13 issues an instruction to the voltage supply circuits 11 and 12 to set a state in which the circuits can generate preset voltages.

Subsequently, the sequencer 13 sets a block address and page address of the ROM fuse region and outputs the addresses to the row decoder 5 (step S11). In the example of FIG. 7, the sequencer 13 issues a block address that designates block BLK0 and page addresses that designate pages PG18, PG74 and PG 90.

Then, the sequencer 13 reads ROM fuse information from block BLK0 (step S12). The read operation is called "power-on-read". More specifically, the sequencer 13 issues a read instruction of ROM fuse information. In response to the instruction, the voltage supply circuit 11 generates a necessary voltage and the row decoder 5 applies the preset voltage generated from the voltage supply circuit 11 to word lines WL and selection gate lines SGD, SGS. As a result, ROM fuse information is read to bit line BL and the sense amplifier 3 senses and amplifies the read data. Further, the sense amplifier 3 stores the thus sensed and amplified ROM fuse information in the page buffer 4. In the power on read, ROM fuse information is read from three pages PG18, PG74 and PG90.

Subsequently, the page buffer 4 executes a majority logic operation in response to the instruction of the sequencer 13 (step S13). That is, in this example, since ROM fuse information is written in the three pages, 3-bit ROM fuse information is obtained for each bit line BL. Therefore, the page buffer 4 takes a majority decision for the three bits. That is, whether the number of "1" data items or the number of "0" data items is larger among the three bits is determined and data that is larger in number is selected.

Then, for example, the sequencer 13 reads the majority logic operation result in step S13 from the page buffer 4 via the data bus 6 (step S14). Further, the sequencer 13 stores the majority logic operation result as ROM fuse information in the register of the NAND flash memory 1.

1.2.2 Detail of Majority Logic Operation

Figure 9:
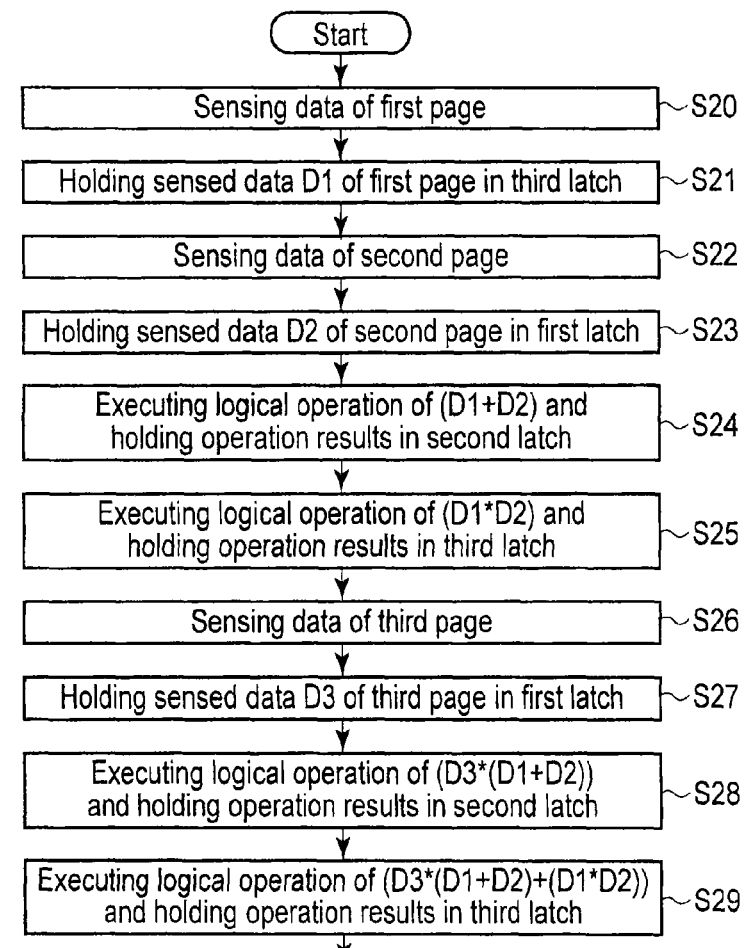
FIG. 9 is a timing chart showing a majority logic operation method according to the first embodiment.

Next, the detail of the operation related to the majority logic operation explained in steps S12 and S13 is explained with reference to FIG. 9 and FIG. 10. FIG. 9 is a flowchart showing steps S12 and S13 in detail. FIG. 10 is a schematic diagram showing data held in the first to third latch circuits 51 to 53 corresponding to one bit line BL. In the following description, a case wherein the same ROM fuse information is stored in three pages (first to third pages) is explained as an example.

As shown in the drawing, first, the sense amplifier 3 reads ROM fuse information from the first page and senses and amplifies the same (step S20). That is, the respective bits of ROM fuse information read to bit lines BL0 to BL(L−1) are read by the corresponding sense circuits 40. The ROM fuse information (that is called data D1) sensed in step S20 is held in the third latch circuit 53 (step S21, state (a) of FIG. 10).

Subsequently, the sense amplifier 3 reads ROM fuse information from the second page and senses and amplifies the same (step S22). The ROM fuse information (that is called data D2) sensed in step S22 is held in the first latch circuit 51 (step S23, state (b) of FIG. 10).

Next, the arithmetic operation circuit 50 performs a logical OR operation of data items D1 and D2 held in the corresponding first and third latch circuits 51 and 53. The operation result (D1+D2) is held in the second latch circuit (step S24, state (c) of FIG. 10).

Then, the arithmetic operation circuit 50 performs a logical AND operation of data items D1 and D2 held in the corresponding first and third latch circuits 51 and 53. The operation result (D1*D2) is held in the third latch circuit (step S25, state (d) of FIG. 10).

Subsequently, the sense amplifier 3 reads ROM fuse information from the third page and senses and amplifies the same (step S26). The ROM fuse information (that is called data D3) sensed in step S26 is held in the first latch circuit 51 (step S27, state (e) of FIG. 10).

Next, the arithmetic operation circuit 50 performs a logical AND operation of data items D3 and (D1+D2) held in the corresponding first and second latch circuits 51 and 52. The operation result D3*(D1+D2) is held in the second latch circuit (step S28, state (f) of FIG. 10).

Then, the arithmetic operation circuit 50 performs a logical OR operation of data items D3 *(D1+D2 ) and (D1 *D2 ) held in the corresponding second and third latch circuits 52 and 53. The operation result (D3 *(D1+D2)+(D1 *D2 )) is held in the third latch circuit (step S29, state (g) of FIG. 10).

Thus, the operation is terminated and the third latch circuit 53 outputs the operation result (D3 *(D1+D2)+(D1*D2 )) held therein. The operation result (D3 *(D1+D2)+(D1*D2 )) expresses data that has a majority of "0" or "1" among 3-bit data of data items D1 to D3.

1.2.3 Concrete Example of Majority Logic Operation

Figure 11:
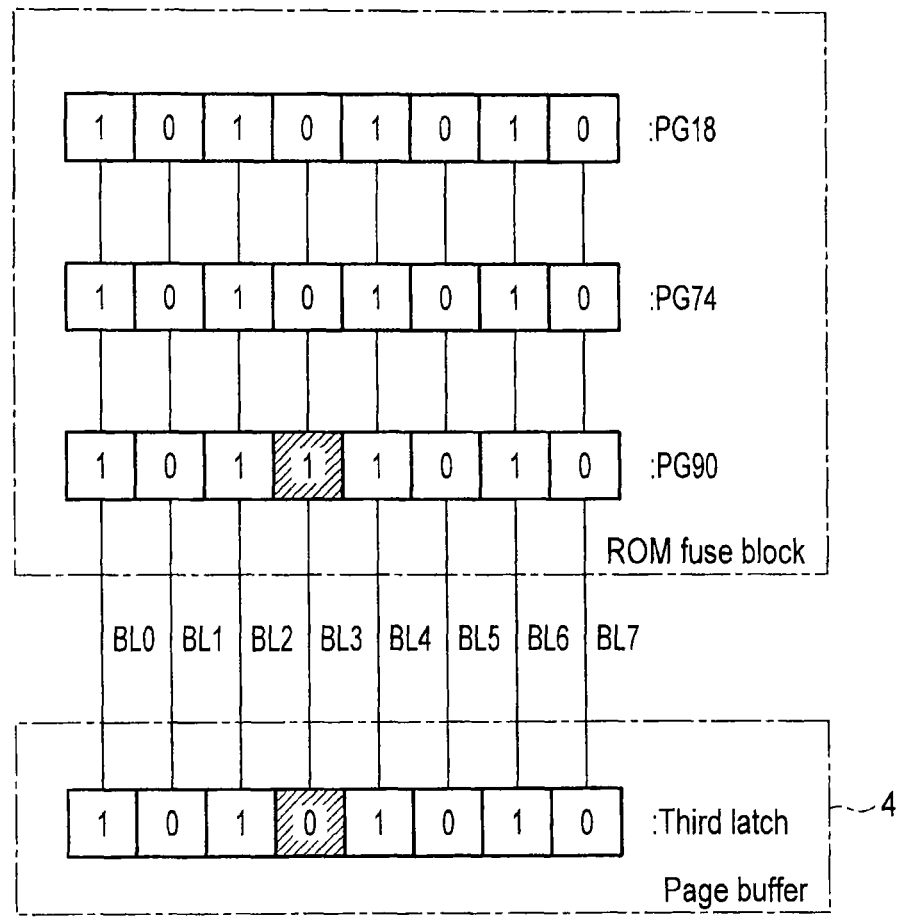
FIG. 11 is a diagram showing a concrete example of a majority logic operation method according to the first embodiment.

The concrete example of the majority logic operation is simply explained with reference to FIG. 11. FIG. 11 is a block diagram showing partial regions of the ROM fuse regions and page buffer 4. In FIG. 11, for brief explanation, a case where one page includes eight bits is shown as an example.

As shown in the drawing, in page PG18, "10101010" is stored as ROM fuse information. Likewise, "10101010" is stored in page PG74. The fourth bit of data in page PG90 is inverted and "10111010" is stored.

The page buffer 4 performs a majority logic operation for the respective bits and holds the result in the third latch circuit 53. That is, in this example, it is determined whether "1" or "0" has a majority in 3-bit data "111" read from three pages PG18, PG74 and PG90 for bit line BL0, for example. In this example, since all of the bits are "1", "1" obtained as the majority logic operation result is held in the third latch circuit 53. It is determined whether "1" or "0" has a majority in 3-bit data "000" read from three pages PG18, PG74 and PG90 for bit line BL1. In this example, since all of the bits are "0", "0" obtained as the majority logic operation result is held in the third latch circuit 53. Since the bit in page PG90 is inverted for bit line BL3, "001" is obtained as 3-bit data. Since "0" has a majority in "1" and "0", "0" obtained as the majority logic operation result is held in the third latch circuit 53.

1.3 Effect in Present Embodiment

With the configuration of this embodiment, data read precision can be enhanced and the reliability of the operation of the semiconductor memory device can be enhanced. The effect is explained below.

In the NAND flash memory, various parameters (ROM fuse information) required for operating the memory are written in the ROM fuse regions. ROM fuse information is read by power on read at the power-on time and various parameters are set in the register. By referring to the parameters, the controller can correctly control the NAND flash memory. Therefore, in order to correctly operate the NAND flash memory, it is necessary to correctly read the ROM fuse information. Further, when power on read is performed, an error correction operation cannot be performed according to an ECC (Error Checking and Correcting) process by the controller. Therefore, it is necessary to provide a mechanism for correctly reading ROM fuse information in the NAND flash memory.

Figure 12:
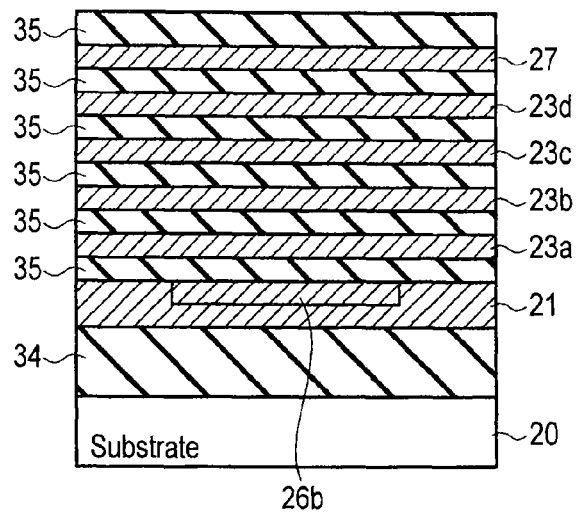
FIG. 12 to FIG. 14 are cross-sectional views sequentially showing a portion of the manufacturing steps of a memory cell array.
Figure 13:
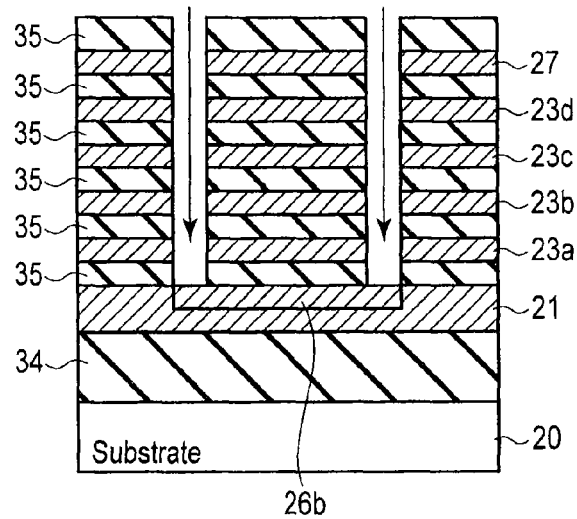
Figure 14:
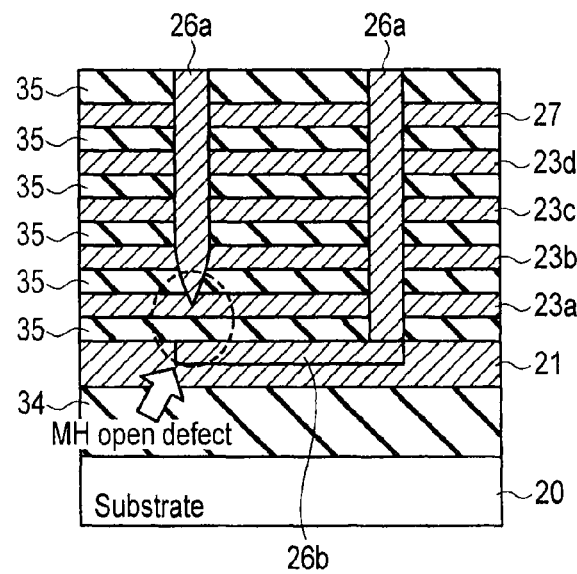

In this respect, if the three-dimensional NAND flash memory explained with reference to FIG. 3 and FIG. 4 is used, defects tend to occur in the memory cell array because of its structure. A typical example of the defect is an open defect of a memory hole ("MH open defect"). The MH open defect is explained with reference to FIG. 12 to FIG. 14. FIG. 12 to FIG. 14 show a portion of the manufacturing steps of the memory cell array 2.

First, as shown in FIG. 12, after a peripheral circuit is formed on a semiconductor substrate 20, an inter-layer insulating film 34 is formed to cover the peripheral circuit. Then, a back-gate line layer 21 and semiconductor layer 26b are formed on the inter-layer insulating film 34. Further, inter-layer insulating films 35 and semiconductor layers 23a to 23d are alternately formed on the back-gate line layer 21 and semiconductor layer 26b.

Next, as shown in FIG. 13, holes (memory holes) that penetrate the inter-layer insulating films 35 and semiconductor layers 23a to 23d and reach the semiconductor layer 26b are made. Each memory hole is filled with the semiconductor layer 26a after a charge accumulation layer, block layer and gate insulating film are formed on the sidewall thereof.

However, the memory hole becomes deeper as the number of layers of the semiconductor layers 23a to 23d increases. Then, it becomes difficult to make a memory hole with the depth that reaches the semiconductor layer 26b. The state of this case is shown in FIG. 14. FIG. 14 shows the state obtained when the semiconductor layers 26a are filled in the memory holes. As shown in FIG. 14, if the memory hole does not reach the semiconductor layer 26a, the semiconductor layers 26a and 26b are separated. This is an MH open defect.

If an MH open defect occurs, no cell current flows in the NAND string 16 irrespective of held data of the memory cell transistor. Therefore, it is always determined that read-data is "0" data (the threshold voltage is high and the memory cell transistor is set in the off state).

Further, a short defect ("MH short defect") of a memory hole tends to occur. The MH short defect is a defect in which adjacent memory holes are electrically shorted. In order to prevent occurrence of the MH open defect explained with reference to FIG. 12 to FIG. 14, it is necessary to make a memory hole with a sufficiently large depth. For this purpose, it is necessary to increase the diameter of the memory hole. However, if the diameter of the memory hole is excessively increased, adjacent memory holes are connected and the memory holes are shorted.

Since ROM fuse information is important data used as basic parameters required for operating the NAND flash memory 1, it is necessary to correctly read ROM fuse information even in the state in which an MH open defect and MH short defect tend to occur.

In this respect, with the configuration of this embodiment, ROM fuse information is held in plural pages (three or more pages). That is, ROM fuse information is multiplexed over plural pages. When ROM fuse information is read, a majority logic operation is performed for data read from the plural pages and ROM fuse information is determined based on the result.

Therefore, even when a defect is present in one bit of one page and erroneous data is read, the data can be corrected to correct data. For example, when ROM fuse information is multiplexed over three pages, 3-bit data is read for each bit line and even if an error occurs in one bit, the error can be corrected. Therefore, the reliability of the operation of the NAND flash memory can be enhanced.

In this embodiment, a case wherein ROM fuse information is written in three pages is explained as an example, but ROM fuse information may be written in four or more pages. In this case, the number of bits that can be corrected becomes larger as the number of pages to be multiplexed increases, but it is necessary to increase the number of latch circuits of the page buffer 4 accordingly. For example, if ROM fuse information is multiplexed in five pages and when errors occur in two bits among the five bits, the errors can be corrected. Further, it is preferable that the number of pages to be multiplexed is odd from the viewpoint of the characteristic of the majority logic operation.

In this embodiment, the majority logic operation is performed by the arithmetic operation circuit 50 of the page buffer 4. The arithmetic operation circuit 50 is a circuit generally embedded to the NAND flash memory 1. Therefore, an increase in the number of circuits required for the majority logic operation is suppressed to a minimum and substantially no increase in the cost for performing this embodiment is provided. Further, the majority logic operation can be simultaneously performed in the page unit. That is, a process for performing the majority logic operations in parallel for bits in the page can be performed at high speed.

2. Second Embodiment

Next, a semiconductor memory device according to a second embodiment is explained. This embodiment relates to a data format of ROM fuse information explained in the first embodiment. In the following description, only portions different from the first embodiment are explained.

2.1 Data Format of ROM Fuse Information

Figure 15:
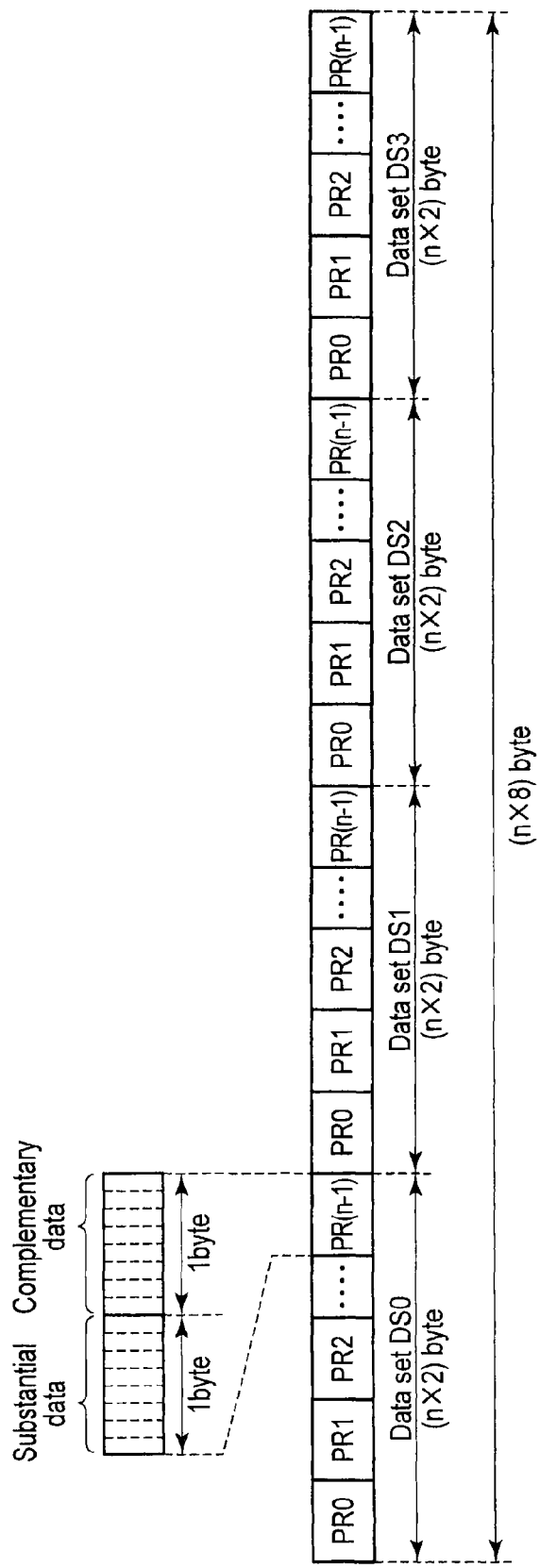
FIG. 15 is a schematic diagram showing the structure of ROM fuse data according to a second embodiment.

FIG. 15 shows the data format of ROM fuse information according to this embodiment and shows the structure of ROM fuse information of one page.

As shown in the drawing, one page roughly includes four data sets DS (DS0 to DS3). Data sets DS0 to DS3 have the same contents and the size of each data set is (n×2) bytes (n is a natural number equal to or larger than 2), for example.

Each data set DS includes n parameters PR (PR0 to PR(n−1)). Bad block information, column redundancy information or the like explained in FIG. 6 is expressed by use of n parameters PR. The size of each parameter PR is two bytes, for example.

Each parameter PR roughly includes substantial data and complementary data. The substantial data is ROM fuse information itself and the complementary data is information that is complementary to the substantial data. That is, if substantial data is "1", complementary data is "0". The size of each of the substantial data and complementary data is one byte (eight bits), for example.

2.2 Read Method of ROM Fuse Information

Next, a read method of ROM fuse information according to this embodiment is explained with reference to FIG. 16. FIG. 16 is a flowchart showing the operation of a NAND flash memory 1 immediately after the power supply is turned on and corresponds to FIG. 8 explained in the first embodiment.

As shown in the drawing, like the first embodiment, after the process of steps S10 to S13 is performed, for example, a sequencer 13 initializes a parameter address and a set address (step S30). The parameter address is an address for designating one of parameters PR0 to PR(n−1) shown in FIG. 15 and the set address is an address for designating one of data sets DS0 to DS3 shown in FIG. 15. By initializing the addresses, the parameter address designates parameter PR0 and the set address designates data set DS0.

Then, the sequencer 13 reads 2-byte data from the page buffer 4 based on the address obtained in step S30 (step S31). That is, in the page buffer 4, parameter PR0 is read to the sequencer 13 from a third latch circuit 53 corresponding to bit lines BL0 to BL15. Of course, data read in this step is the result obtained by performing the majority logic operation.

Subsequently, the sequencer 13 checks whether or not substantial data and complementary data are correctly set in the complementary relationship (step S32). If both data items are correctly set in the complementary relationship (step S33, YES), whether or not the parameter address is a final address is determined (step S34). That is, it is determined whether or not the parameter address is an address that designates parameter PR(n−1). If the parameter address is the final address (step S34, YES), the sequencer 13 determines that all of parameters PR0 to PR(n−1) are correctly read and sets "Status Pass" in the status register of the NAND flash memory 1 (step S35). As a result, the controller can recognize that the NAND flash memory 1 can be set in a usable state.

If it is determined in step S34 that the parameter address is not the final address (step S34, NO), the sequencer 13 increments the parameter address (step S36). That is, if the present parameter address is an address that designates parameter PRj (j is one of 0 to (n−1)), the sequencer updates the address to an address that designates parameter PR(j+1). Of course, the present method is given only as one example and, for example, it is possible to decrement an address from the final address and various methods can be applied. Further, the sequencer 13 initializes the set address (step S37). Then, the process returns to step S31. That is, 2-byte data is read from the page buffer 4 based on the updated address (step S31).

If it is determined in step S33 that substantial data and complementary data are not set in the complementary relationship, it is determined that the parameter is not highly reliable and should not be used (step S33, NO). Therefore, the sequencer 13 determines whether or not the set address is the final address (step S38). That is, it is determined whether or not the set address is an address that designates data set DS3. If the address is the final address (step S38, YES), the sequencer 13 determines that one of parameters PR0 to PR(n−1) could not be correctly read and sets "Status Fail" in the status register of the NAND flash memory 1 (step S39). As a result, the controller can recognize that the NAND flash memory 1 cannot be used.

If it is determined in step S38 that the address is not the final address (step S38, NO), the sequencer 13 increments the set address while the parameter address is kept unchanged. Then, the sequencer reads 2-byte data of the same parameter address in a next data set from the page buffer 4 based on the updated address (step S40). Then, the process proceeds to step S32.

2.3 Concrete Example of Read Method

A concrete example of steps S30 to S40 explained in FIG. 16 is explained with reference to FIG. 17. FIG. 17 is a schematic diagram showing the structure of ROM fuse information and shows the order of accessing parameters PR. Further, in FIG. 17, a hatched parameter indicates that substantial data and complementary data are not correctly set in the complementary relationship.

As shown in the drawing, first, parameter PR0 of data set DS0 is read, parameter PR1 is read and then parameter PR2 is read. However, since parameter PR2 has a defect (step S33, NO), parameter PR2 of data set DS1 is read (step S40).

Since parameter PR2 is correctly read, parameter DS3 of data set DS0 is next read (steps S36, S37) and then parameter PR4 is read. However, since parameter PR4 has a defect (step S33, NO), parameter PR4 of data set DS1 is read (step S40). Since parameter PR4 also contains a defect (step S33, NO), parameter PR4 of data set DS2 is read (step S40). Since parameter PR4 is correctly read, parameter DS5 of data set DS0 is next read (steps S36, S37). The same operation is performed.

2.4 Effect According to Present Embodiment

According to this embodiment, the read precision of ROM fuse information can be further enhanced in comparison with the first embodiment.

According to this embodiment, ROM fuse information is multiplexed in one page. That is, ROM fuse information is multiplexed not only in the column direction but also in the row direction. More specifically, as explained in FIG. 15, a plurality of data blocks are contained in one page and the same information is contained in each data block. Then, if information is not correctly read from one of the data blocks, information is read from a different data block. Therefore, even if one of the data blocks has a defect, correct ROM fuse information can be obtained.

3. Third Embodiment

Next, a semiconductor memory device according to a third embodiment is explained. This embodiment relates to the arrangement of a plurality of pages used as the ROM fuse regions in the second embodiment. In the following description, only portions different from those of the first and second embodiments are explained.

3.1 Arrangement of ROM Fuse Regions

Figure 19:
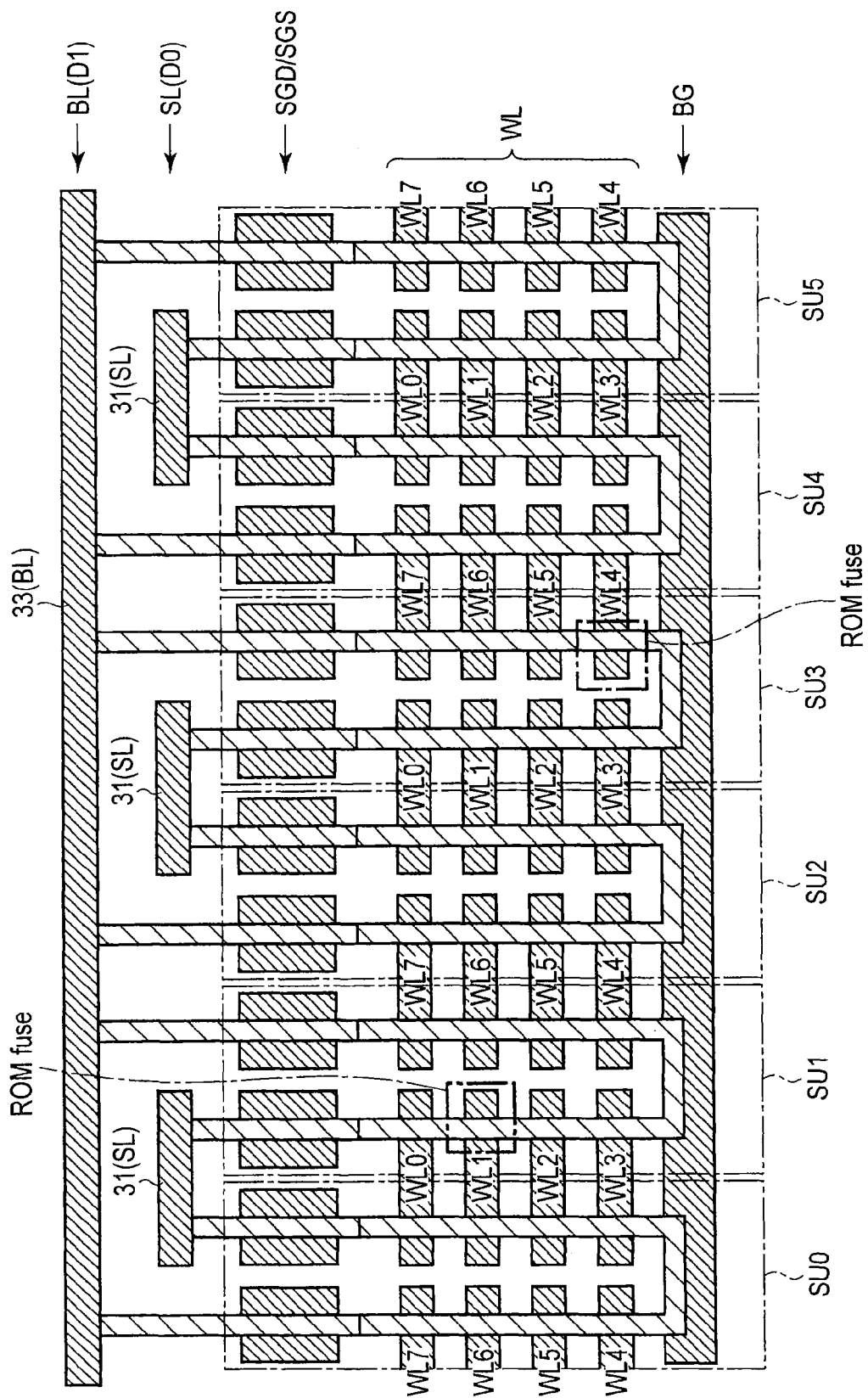
FIG. 19 is a cross-sectional view of the memory cell array according to the third embodiment.

The arrangement of ROM fuse regions according to this embodiment is explained with reference to FIG. 18 and FIG. 19. FIG. 18 is a circuit diagram of a memory cell array 2 and shows the configuration corresponding to one bit line BL. FIG. 19 is a cross-sectional view of block BLK10 of FIG. 18. In practice, the same configurations are arranged in a direction perpendicular to the sheets of FIG. 18 and FIG. 19 and NAND strings arranged in the perpendicular direction configure string unit SU.

In an example of FIG. 18, blocks BLK10 and BLK20 are allocated to a ROM fuse block. A page corresponding to word line WL1 of string unit SU1 of block BLK10, a page corresponding to word line WL4 of string unit SU3 and a page corresponding to word line WL7 of string unit SU10 of block BLK20 are used as ROM fuse regions.

That is, at least two of the pages (that are hereinafter referred to as ROM fuse pages) used as the ROM fuse regions have at least one of the following relationships.

(1) Plural ROM fuse pages belong to different string units SU. More preferably, the pages belong to string units SU that are not physically adjacent to each other.

(2) Plural ROM fuse pages are associated with different word lines WL. More preferably, pages that are not physically adjacent to each other or two pages are set to correspond to two-layered word line layers provided to physically sandwich at least one word line layer. That is, in an example of FIG. 19, word lines WL0 and WL7 are formed of the same word line layer, word lines WL1 and WL6 are formed of the same word line layer, word lines WL2 and WL5 are formed of the same word line layer and word lines WL3 and WL4 are formed of the same word line layer. Then, the ROM fuse pages are allocated to plural pages formed of different word line layers and, at this time, it is preferable to set at least one word line layer between the word line layers used for ROM fuse page.

(3) Plural ROM fuse pages belong to different blocks. In the example of FIG. 18, two ROM fuse pages belong to block BLK10 and the remaining one ROM fuse page belongs to block BLK20. Of course, all of the three pages may belong to blocks BLK that are different from one another. Such an example is shown in FIG. 20. In FIG. 20, three ROM fuse pages respectively belong to blocks BLK10, BLK20 and BLK40.

3.2 Effect according to Present Embodiment

According to this embodiment, it is possible to prevent defects from simultaneously occurring in a plurality of ROM fuse pages and enhance the error correction effect of ROM fuse information. The effect is explained below.

3.2.1 Types of Defects

Figure 21:
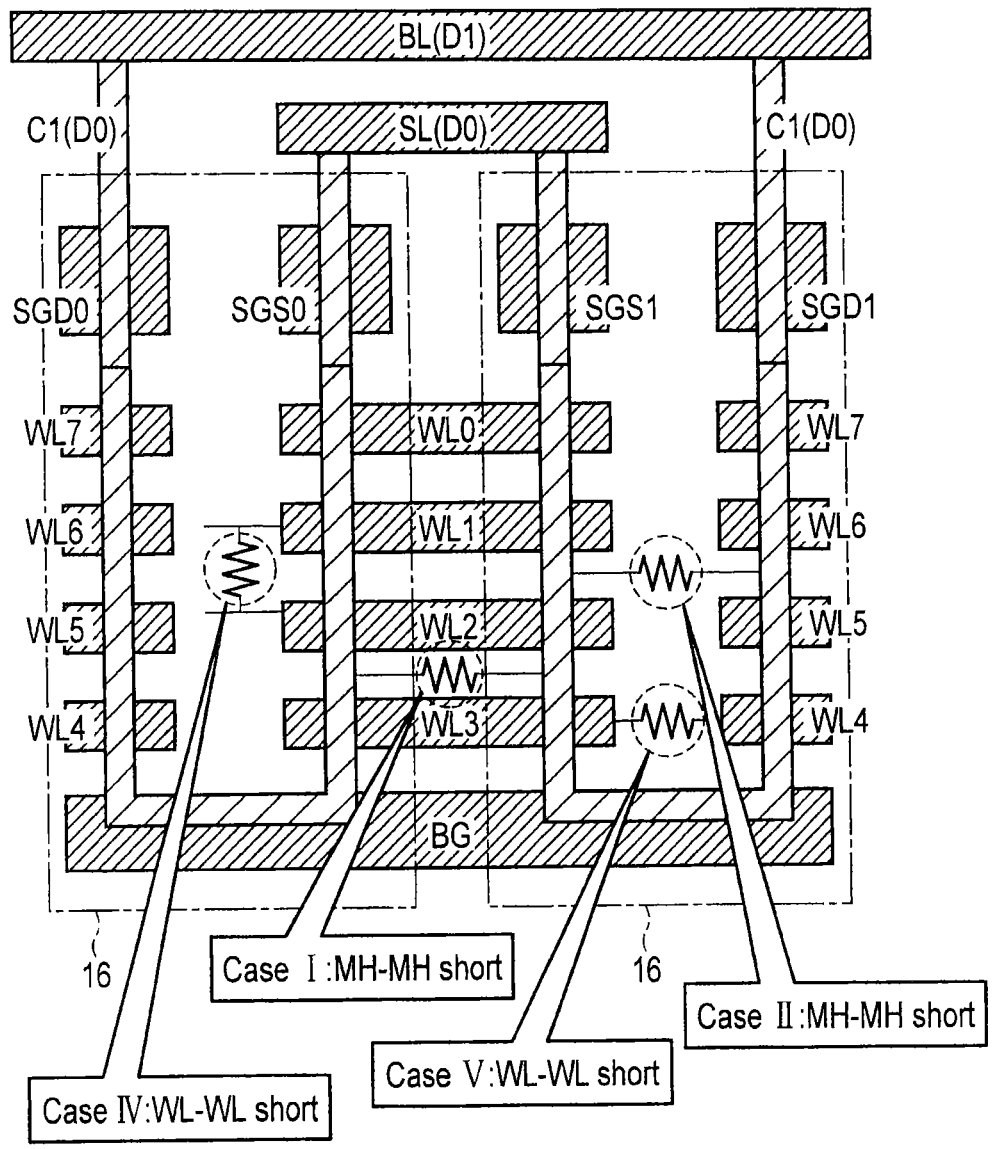
FIG. 21 is a cross-sectional view of the memory cell array.

Various defects may occur in a three-dimensional NAND flash memory and the examples of the defects are explained with reference to FIG. 21 and FIG. 22. FIG. 21 and FIG. 22 are a cross-sectional view of a memory cell array and a plan view of word lines.

(1) MH Open Defect

The MH open defect is the defect as explained in FIG. 11 to FIG. 13.

(2) MH Short Defect

The MH short defects are defects shown in Cases I, II and III of FIG. 21 and FIG. 22. In Case I, memory holes of different string units adjacent in the bit line direction are shorted. In this case, the two adjacent string units become defective. Also, in Case II, memory holes adjacent in the bit line direction are shorted and defective, but a short-defect occurs in one string unit. In Case III, memory holes adjacent in the word line direction are shorted and defective and, in this case, a short-defect occurs in one string unit.

(3) WL Short Defect

Defects (WL short defects) in which adjacent word lines are shorted are defects shown in Cases IV and V of FIG. 21 and FIG. 22. In Case IV, a short-defect occurs in the stacked direction of the word lines. Since the word line is shared by adjacent two string units, the short-defect gives an influence to the two string units. In Case V, a short-defect of word lines occurs in an in-plane direction of the semiconductor substrate (a direction along the bit line). In this case, the word line defect gives an influence to three string units and is regarded as a block defect if no particular relief measure is taken.

3.2.2 Present Embodiment

In this embodiment, even when the above defect occurs, a bad influence on the ROM fuse region can be suppressed to minimum. The detail thereof is explained below.

(1) A case wherein a plurality of ROM fuse pages are provided in different string units:

As explained in FIG. 12 to FIG. 14, when an MH open defect occurs in a NAND string, the whole portion of the NAND string becomes defective. However, the MH open defect does not give an influence to the other NAND strings. Therefore, even when an MH open defect occurs in one string unit, the defect can be prevented from giving an influence to the other ROM fuse pages by providing plural ROM fuse pages in different string units. This is true when defects in Cases II and III occur.

Further, the influence by the MH short defect of Case I can also be suppressed by providing plural ROM fuse pages in string units that are not physically adjacent.

(2) A case wherein a plurality of ROM fuse pages are provided in correspondence to different word lines WL:

The influence by the WL short defect of Case V can be suppressed by using pages provided in correspondence to different word lines as ROM fuse regions. That is, a short defect occurring in one of the word line layers used as the ROM fuse regions does not give a bad influence to the other ROM fuse regions provided in correspondence to the other word line layers.

Further, the influence in Case IV can also be suppressed by providing plural ROM fuse pages in correspondence to pages that are not physically adjacent.

4. Modification or the Like

As described above, in the semiconductor memory device according to the embodiment, data is read in the page unit. The semiconductor memory device includes a memory cell array; a plurality of latch circuits (51 to 53 in FIG. 5); and an arithmetic operation circuit (50 in FIG. 5). The memory cell array holds data multiplexed in at least three pages (PG18, PG74, PG90 in FIG. 7). The plural latch circuits (51 to 53 in FIG. 5) read and hold the multiplexed data at the startup. The arithmetic operation circuit (50 in FIG. 5) performs an operation by use of the multiplexed data.

According to this configuration, it is possible to read ROM fuse information with high precision and the reliability of the operation of the semiconductor memory device can be enhanced.

The embodiments explained above can be variously modified. For example, in the above embodiments, ROM fuse information is multiplexed and a majority logic operation is performed at the power-on-reading to acquire conclusive ROM fuse information. However, this method is not limited to the ROM fuse data and can be carried out for data stored in block BLK other than the ROM fuse regions. As data to which this method is applied, for example, important information (for example, a FAT table or the like in a FAT file system) such as system information or normal user data may be used.

Further, the data pattern of ROM fuse information is not limited to the case of FIG. 15 explained in the second embodiment and various patterns can be used. Further, in the data pattern of FIG. 15, a valid flag may be provided in the head bit of each parameter. The valid flag is information indicating whether the corresponding parameter is valid or not and if the parameter is invalid, a parameter may be read from a next data set.

Further, in the above embodiments, a case wherein the majority logic operation is performed for multiplexed data is explained as an example. However, the operation is not limited to the majority logic operation and if the operation can correct an error by use of multiplexed data, the operation is not particularly limited. For example, an ECC circuit may be provided in the NAND flash memory 1 and an error can be corrected by performing an ECC process.

Further, in the above embodiments, the three-dimensional stacked NAND flash memory is explained as an example. However, the three-dimensional stacked structure is not limited to the structure explained with reference to FIG. 3 and FIG. 4 and the other structure can be used. Further, the structure that does not include back-gate transistors BT can be used. The embodiment can be applied to a normal plane NAND flash memory having memory cells two-dimensionally arranged on the semiconductor substrate and can also be applied to a memory device other than the NAND flash memory.

Further, in the process of the flowchart explained in the above embodiment, the order of the steps can be exchanged as far as possible or a plurality of processes can be simultaneously performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device reading data in units of page, the device comprising:
   a memory cell array configured to hold data multiplexed in at least three pages;
   a plurality of latch circuits configured to read and hold the multiplexed data at a startup; and
   an arithmetic operation circuit configured to perform operations by use of the multiplexed data.

2. The device according to claim 1, wherein the operation is a majority logic operation.

3. The device according to claim 1, wherein the memory cell array includes a plurality of memory cells associated with rows and columns,
   the page includes a plurality of memory cells arranged on the same row, and
   the data is multiplexed in a column direction.

4. The device according to claim 1, wherein the plural latch circuits include first to third latch circuits,
   the data is multiplexed in first to third pages,
   first data read from the first page is stored in the third latch circuit at the startup,
   second data read from the second page is stored in the first latch circuit,
   a logical OR operation result of the first data and second data is stored in the second latch circuit,
   a logical AND operation result of the first data and second data is stored in the third latch circuit,
   third data read from the third page is stored in the first latch circuit,
   a logical AND operation result of the third data and the logical OR operation result is stored in the second latch circuit, and
   a logical OR operation result of a logical AND operation result of the first data and second data and a logical AND operation result of the third data and the logical OR operation result is stored in the third latch circuit.

5. The device according to claim 1, wherein the multiplexed data items are multiplexed in each page.

6. The device according to claim 5, wherein the multiplexed data includes substantial data and complementary data in each page.

7. The device according to claim 1, wherein the memory cell array includes a plurality of string units which are a set of a plurality of NAND strings each including first and second selection transistors and a plurality of memory cells serially connected between the first and second selection transistors, and at least two pages among the three pages which hold the multiplexed data are allocated to different ones of the string units.

8. The device according to claim 7, wherein at least one different string unit is inserted between the two string units to which at least two pages of the three pages are allocated.

9. The device according to claim 1, wherein the memory cell array includes:

a plurality of string units which are a set of a plurality of NAND strings each including first and second selection transistors and a plurality of memory cells serially connected between the first and second selection transistors, and a plurality of word lines each of which commonly connects plural ones of the memory cells, at least one page is allocated to the plural memory cells connected to the same word line in the string unit, and at least two pages of the three pages which hold the multiplexed data are allocated to different word lines.

10. The device according to claim 9, wherein at least one different word line is inserted between two word lines to which at least two pages of the three pages are allocated.

11. The device according to claim 9, wherein the plural word lines are stacked above a semiconductor substrate.

12. The device according to claim 1, wherein the memory cell array includes a plurality of memory cells three-dimensionally stacked above a semiconductor substrate.

13. The device according to claim 1, wherein the multiplexed data is ROM fuse information.

14. A method for reading data from a semiconductor memory device which stores data multiplexed in a plurality of pages, the method comprising:

reading first data of the multiplexed data from a first page at a startup;

reading second data of the multiplexed data from a second page after the first data is read;

reading third data of the multiplexed data from a third page after the second data is read; and performing an operation by use of the first to third data to determine contents of the multiplexed data.

15. The method according to claim 14, wherein the operation is a majority logic operation for bits of the first to third data.

16. The method according to claim 14, wherein the semiconductor memory device has a plurality of memory cells three-dimensionally stacked above a semiconductor substrate.

17. The method according to claim 14, wherein the multiplexed data is ROM fuse information.

18. The device according to claim 1, wherein the arithmetic operation circuit determines a single data from the multiplexed data.

19. The device according to claim 18, wherein at least a part of the single data is for use as parameter data for the semiconductor memory device.

20. The device according to claim 19, wherein the single data has a size of the page.

21. The method according to claim 14, wherein the performing an operation includes determining a single data from the multiplexed data.

22. The method according to claim 21, wherein at least a part of the single data is for use as parameter data for the semiconductor memory device.

23. The method according to claim 22, wherein the single data has a size of each of the pages.

* * * * *